(12) United States Patent
Kuzmenka et al.

(10) Patent No.: US 12,387,778 B2
(45) Date of Patent: Aug. 12, 2025

(54) PHASE-TO-PHASE MISMATCH REDUCTION IN A CLOCK CIRCUIT OF A MEMORY DEVICE

(71) Applicant: Micron Technology, Inc., Boise, ID (US)

(72) Inventors: Maksim Kuzmenka, Munich (DE); Fabien Funfrock, Munich (DE)

(73) Assignee: Micron Technology, Inc., Boise, ID (US)

( * ) Notice: Subject to any disclaimer, the term of this patent is extended or adjusted under 35 U.S.C. 154(b) by 363 days.

(21) Appl. No.: 17/813,484

(22) Filed: Jul. 19, 2022

(65) Prior Publication Data

US 2024/0029779 A1    Jan. 25, 2024

(51) Int. Cl.
*G11C 11/4076* (2006.01)
*H03K 3/03* (2006.01)

(52) U.S. Cl.
CPC ........ *G11C 11/4076* (2013.01); *H03K 3/0315* (2013.01)

(58) Field of Classification Search
CPC .......................... G11C 11/4076; G11C 11/407
USPC .......................................................... 365/156
See application file for complete search history.

(56) References Cited

U.S. PATENT DOCUMENTS

| | | | |
|---|---|---|---|
| 6,104,253 A * | 8/2000 | Hall .......................... | G06F 1/10 331/74 |
| 11,881,858 B2 * | 1/2024 | Tian ....................... | H03K 5/135 |
| 2008/0024233 A1 * | 1/2008 | Drake .................... | H03K 3/012 331/25 |
| 2008/0055996 A1 * | 3/2008 | Kim ....................... | G11C 16/32 365/185.2 |
| 2012/0081170 A1 * | 4/2012 | Marutani ................ | G06G 7/161 327/360 |
| 2018/0336932 A1 * | 11/2018 | Fujitani .................. | H02M 1/143 |
| 2022/0131545 A1 * | 4/2022 | Li .............................. | H03L 1/02 |

* cited by examiner

*Primary Examiner* — Muna A Techane
(74) *Attorney, Agent, or Firm* — Harrity & Harrity, LLP

(57) ABSTRACT

A memory device may include memory cell array a clock circuit configured to generate a plurality of clock signals for access operations associated with the memory cell array. The clock circuit may include a ring oscillator circuit that is configured to equalize phase distortions of the plurality of clock signals.

20 Claims, 21 Drawing Sheets

PHASE-TO-PHASE MISMATCH REDUCTION IN A CLOCK CIRCUIT OF A MEMORY DEVICE

TECHNICAL FIELD

The present disclosure generally relates to memory devices and, for example, phase-to-phase mismatch reduction in a clock circuit of a memory device.

BACKGROUND

Semiconductor devices may be used for a variety of applications, such as semiconductor memory devices used to store and retrieve information in computer systems. Clock signals may be provided to the semiconductor device (and/or generated by the semiconductor device) to synchronize the operation of various components.

DETAILED DESCRIPTION

Figure 1:
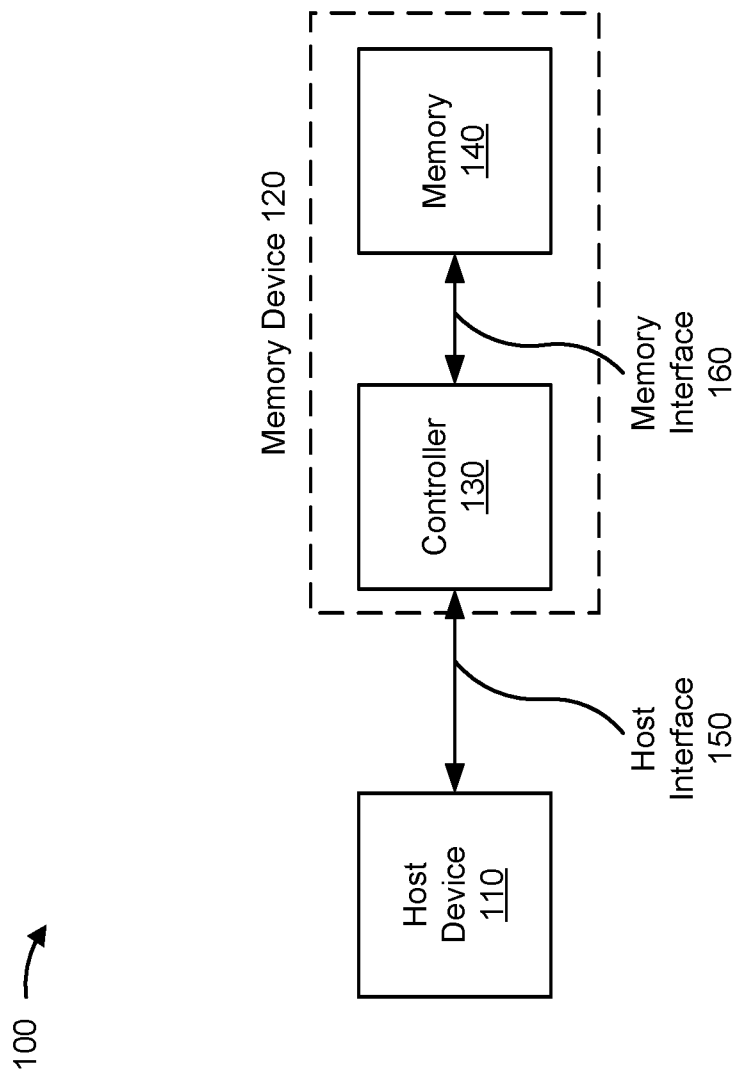
FIG. 1 is a diagram illustrating an example system capable of phase-to-phase mismatch reduction in a clock circuit of a memory device.

Various types of clocking schemes may be used in a semiconductor memory device for timing and synchronization of access operations in the semiconductor memory device. Single-phase clocking (or single data rate (SDR) clocking) refers to the use of a single clock signal. In single-phase clocking, the data rate of access operations coincides with the clock signal frequency of the single clock signal. This renders the clocking insensitive to duty cycle (as there are no other clock signals to which the single click signal is to align duty cycles), but may require a very high clock signal frequency for advanced memory applications.

In two-phase clocking (or double data rate (DDR) clocking), two clock signals that are phase-shifted by 180 degrees may be used for access operations. The 180 degree phase separation may be referred to as differential clock signaling. The differential clock signaling of two-phase clocking enables the data rates to be up to two times greater than the clock frequency of the two clock signals that are used. However, the phase relationship between the clock signals may be sensitive to duty cycle delays and phase-to-phase mismatching.

Four-phase clocking (or quad data rate (QDR) clocking) includes the use of four clock signals that are each separated by 90 degrees from neighboring clock signals, as described above. The two differential pairs of clock signals may be used for differential signaling. This enables data rates to be up to four times greater than the clock frequency of the four clock signals. Moreover, four-phase clocking may provide relaxed layout and power constraints, and reduced demand on transistor performance and metallization performance, relative to other clocking schemes.

However, like two-phase clocking, four-phase clocking may be highly sensitive to phase-to-phase delay mismatching, duty cycle variation, and phase-to-phase jitter. These performance defects can lead to data distortion, read errors, and/or write errors in a semiconductor memory device. Moreover, these performance defects can be exacerbated by the use of circuitry to achieve high clock frequencies and/or high data rates in the semiconductor memory device. For example, a clock signal may propagate through an inverter chain of a re-driver circuit in the semiconductor memory device faster or slower than one or more other clock signals due to imperfections in the inverter chain and/or randomness (e.g., Monte-Carlo effects). As another example, the clock signals of the semiconductor memory device may experience different magnitudes of duty cycle distortion due to differences in transistor size ratios (e.g., ratios between p-type field effect transistor (PFET) and n-type field effect transistor (NFET) sizes) and/or differences in harmonic damping in the signal chains of the clock signals. As another example, the signal chains of the clock signals of the semiconductor memory device may experience different rates of transistor degradation, different temperatures, and/or different supply voltages, which can lead to phase-to-phase delay mismatching, duty cycle variation, and jitter.

Some implementations described herein provide phase-to-phase delay mismatch reduction, and reduction of other types of performance defects such as duty cycle variation and jitter, in a multi-phase clock circuit of a semiconductor memory device. As described herein, a multi-phase clock circuit of a semiconductor memory device may include a ring oscillator circuit that is configured to average clock parameters (e.g., phase distortion, duty cycle delay, jitter) across a plurality of clock signals that are generated by the multi-phase clock circuit. In this way, the clock parameters are equalized across the clock signals, which reduces and/or minimizes performance defects such as phase-to-phase delay mismatching, duty cycle variation, and/or phase-to-phase jitter without the use of additional duty-cycle correction circuitry and/or additional delay trimming circuitry.

Accordingly, the ring oscillator circuit may reduce the likelihood of data distortion in the semiconductor memory device. Moreover, the ring oscillator circuit may reduce the likelihood of read errors in the semiconductor memory device. In addition, the ring oscillator circuit may reduce the likelihood of write errors in the semiconductor memory device.

FIG. 1 is a diagram illustrating an example system 100 capable of phase-to-phase mismatch reduction in a clock circuit of a memory device. The system 100 may include one or more devices, apparatuses, and/or components for performing operations described herein (e.g., for memory device wear leveling). For example, the system 100 may include a host device 110 and a memory device 120. The memory device 120 may include a controller 130 and memory 140. The host device 110 may communicate with the memory device 120 (e.g., the controller 130 of the memory device 120) via a host interface 150. The controller 130 and the memory 140 may communicate via a memory interface 160.

The system 100 may be any electronic device configured to store data in memory. For example, the system 100 may be a computer, a mobile phone, a wired or wireless communication device, a network device, a server, and/or an Internet of Things (IoT) device. The host device 110 may include one or more processors configured to execute instructions and store data in the memory 140. For example, the host device 110 may include a central processing unit (CPU), a graphics processing unit (GPU), a field-programmable gate array (FPGA), an application-specific integrated circuit (ASIC), and/or another type of processing component.

In some implementations, the host device 110 may be or may be included in a vehicle, and may be configured to display (or generate for display) an infotainment system of the vehicle, a digital dashboard of the vehicle, and/or a navigation system of the vehicle, among other examples. In some implementations, the host device 110 may be configured to provide smart or autonomous driving functionality for the vehicle, sensing functionality for the vehicle, and/or another functionality for the vehicle.

The memory device 120 may be any electronic device configured to store data in memory. In some implementations, the memory device 120 may be an electronic device configured to store data persistently in non-volatile memory. For example, the memory device 120 may be a hard drive, a solid-state drive (SSD), a flash memory device (e.g., a NAND flash memory device or a NOR flash memory device), a universal serial bus (USB) thumb drive, a memory card (e.g., a secure digital (SD) card), a secondary storage device, a non-volatile memory express (NVMe) device, and/or an embedded multimedia card (eMMC) device.

In some implementations, the memory device 120 may be configured to store host data for the host device 110. The host data may include, for example, a file system and associated data for a digital dashboard of the vehicle, a file system and associated data for an infotainment system of the vehicle, a mapping database for a navigation system of the vehicle, and/or a point of interest (POI) database for the navigation system of the vehicle, among other examples. Moreover, the memory device 120 may be configured to provide user-accessible storage for user data, which may include storage for user files, audio and/or video recordings, and/or user contact data, among other examples.

The controller 130 may be any device configured to communicate with the host device (e.g., via the host interface 150) and the memory 140 (e.g., via the memory interface 160). Additionally, or alternatively, the controller 130 may be configured to control operations of the memory device 120 and/or the memory 140. For example, the controller 130 may include a memory controller, a system controller, an ASIC, an FPGA, a processor, a microcontroller, and/or one or more processing components.

In some implementations, the memory 140 may include non-volatile memory configured to maintain stored data after the memory device 120 is powered off. For example, the memory 140 may include NAND memory or NOR memory. Additionally, or alternatively, the memory 140 may include volatile memory that requires power to maintain stored data and that loses stored data after the memory device 120 is powered off. For example, the memory 140 may include one or more latches and/or random-access memory (RAM), such as dynamic RAM (DRAM) and/or static RAM (SRAM).

The host interface 150 enables communication between the host device 110 and the memory device 120. The host interface 150 may include, for example, a Small Computer System Interface (SCSI), a Serial-Attached SCSI (SAS), a Serial Advanced Technology Attachment (SATA) interface, a Peripheral Component Interconnect Express (PCIe) interface, an NVMe interface, a USB interface, a Universal Flash Storage (UFS) interface, and/or an embedded multimedia card (eMMC) interface.

The memory interface 160 enables communication between the memory device 120 and the memory 140. The memory interface 160 may include a non-volatile memory interface (e.g., for communicating with non-volatile memory), such as a NAND interface or a NOR interface. Additionally, or alternatively, the memory interface 160 may include a volatile memory interface (e.g., for communicating with volatile memory), such as a DDR interface, a low power DDR (LPDDR) interface, a graphics DDR (GDDR) interface, and/or a QDR interface, among other examples.

As indicated above, FIG. 1 is provided as an example. Other examples may differ from what is described with regard to FIG. 1.

Figure 2:
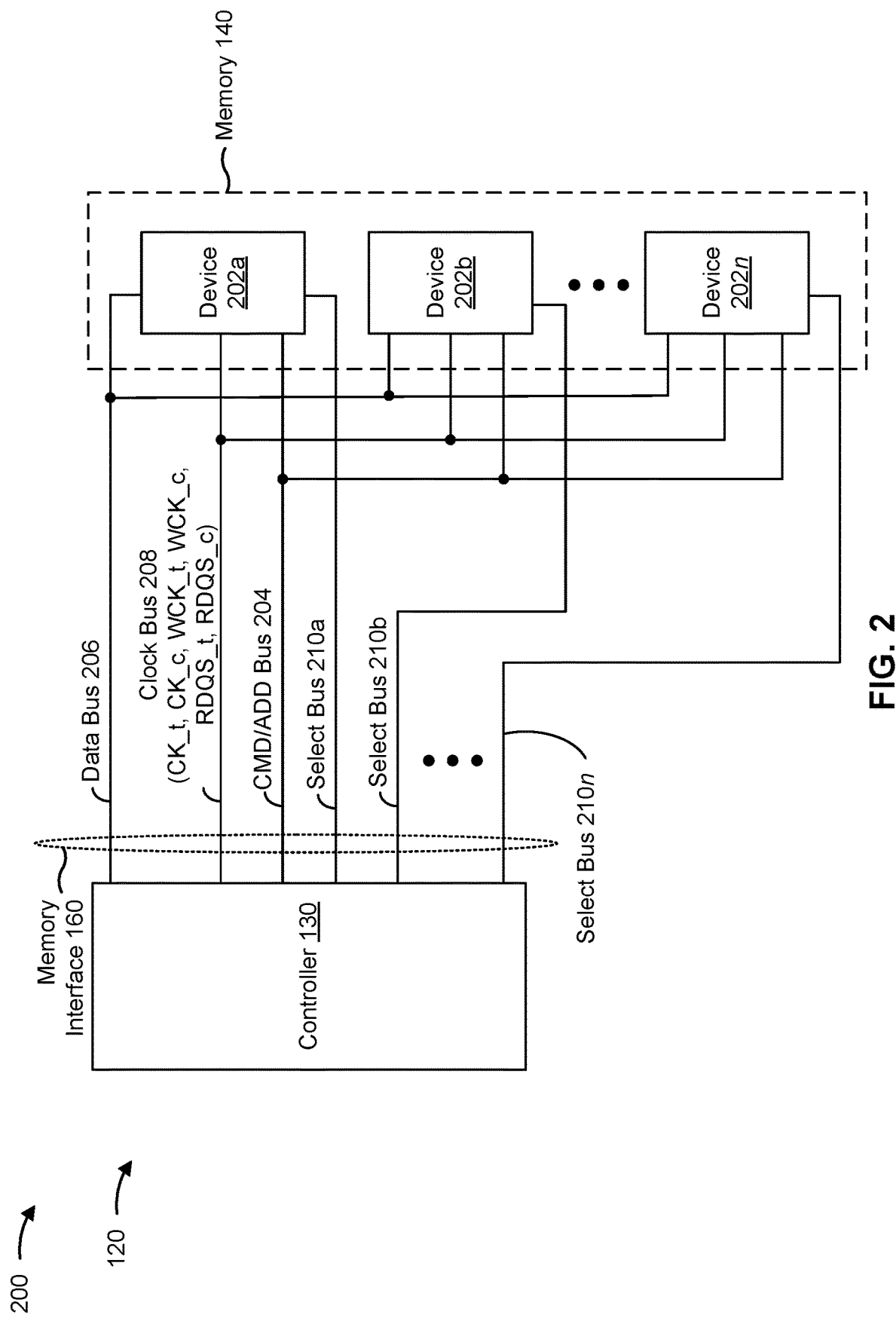
FIG. 2 is a diagram of an example implementation of the memory device described herein.

FIG. 2 is a diagram of an example implementation 200 of the memory device 120 described herein. As shown in FIG. 2, the memory device 120 includes the controller 130 and the memory 140. The memory 140 includes devices 202a-202n, where n is a non-zero whole number. The devices 202a-202n may include memory chips, memory integrated circuits (ICs), and/or another type of memory devices. For example, the devices 202a-202n may include DRAM chips, LPDDR DRAM chips, GDDR DRAM chips, and/or QDR DRAM chips, among other examples.

The devices 202a-202n may each be coupled with the controller 130 by the memory interface 160. The memory interface 160 may include a command/address (CMD/ADD) bus 204, a data (DQ) bus 206, and a clock bus 208. Commands and addresses may be received by the memory 140 on a command/address bus 204, and data may be provided between the controller 130 and the memory 140 on the data bus 206. Various clock signals may be provided between the controller 130 and memory 140 on the clock bus 208.

The clock bus 208 may include signal lines for providing system clock signals (CK_t and CK_c), data clock signals (WCK_t and WCK_c), and/or access data clock signals (RDQS_t and RDQS_c) between the memory 140 and the controller 130. Each of the busses may include one or more signal lines on which signals are provided. The CK_t and CK_c clock signals provided by the controller 130 to the memory 140 may be used for timing the provision and receipt of the commands and addresses on the command/address bus 204. The WCK_t and WCK_c clock signals and the RDQS_t and RDQS_c clock signals may be used for timing the provision of data to the devices 202a-202n.

The CK_t and CK_c clock signals may be complementary, the WCK_t and WCK_c clock signals may be complementary, and the RDQS_t and RDQS_c clock signals may be complementary. Clock signals are complementary when a rising edge of a first clock signal occurs at the same time as a falling edge of a second clock signal, and when a rising edge of the second clock signal occurs at the same time as a falling edge of the first clock signal. The WCK_t and WCK_c clock signals provided by the controller 130 to the memory 140 may be synchronized to the CK_t and CK_c clock signals also provided by the controller 130 to the memory 140. Additionally and/or alternatively, the WCK_t and WCK_c clock signals may have a higher clock frequency than the CK_t and CK_c clock signals. For example, the WCK_t and WCK_c clock signals may have a clock frequency that is approximately four times the clock frequency of the CK_t and CK_c clock signals. However, other values are within the scope of the present disclosure.

The controller 130 may provide commands to the memory 140 to perform memory operations. Examples of memory commands include timing commands for controlling the timing of various operations, access commands for accessing the memory, such as read commands for performing read operations and write commands for performing write operations, mode register write and read commands for performing mode register write and read operations, as well as other commands and operations.

The command signals provided by the controller 130 to the memory 140 may further include select signals (e.g., chip select (CS) signals CS0-CSn). While all of the devices 202a-202n are provided the commands, addresses, data, and clock signals on common busses, the select signals may be provided on respective select busses 210a-210n. The select signals are provided on individual select busses (e.g., a CS0 signal may be provided on select bus 210a to the device 202a, a CS1 signal may be provided on select bus 210b to the device 202b, and so on) to select which of the devices 202a-202n will respond to a particular command and will perform a corresponding operation.

In operation, when a read command and associated address is provided by the controller 130 to the memory 140, a particular device of devices 202a-202n is selected by a corresponding select signal receives the read command and associated address. The device performs a read operation to provide the controller 130 with read data from a memory location corresponding to the associated address. The read data is provided by the device to the controller 130 according to a timing relative to receipt of the read command.

In preparation of the device providing the read data to the controller 130, the controller 130 provides active WCK_t and WCK_c clock signals to the memory 140. The WCK_t and WCK_c clock signals may be used by the device to generate an access data clock signals RDQS_t and RDQS_c. A clock signal is active when the clock signal transitions between low and high clock levels periodically. Conversely, a clock signal is inactive when the clock signal maintains a constant clock level and does not transition periodically. The RDQS_t and RDQS_c clock signals are provided by the device performing the read operation to the controller 130 for timing the provisioning of read data to the controller 130. The controller 130 may use the RDQS_t and RDQS_c clock signals for receiving the read data.

In operation, when a write command and associated address are provided by the controller 130 to the memory 140, the device of the devices 202a-202n that is selected by a received select signal receives the write command and associated address. The device performs a write operation to write data from the controller 130 to a memory location corresponding to the associated address. The write data is provided to the selected device by the controller 130 according to a timing relative to receipt of the write command.

In preparation of the device receiving the write data from the controller 130, the controller 130 provides active WCK_t and WCK_c clock signals to the memory 140. The WCK_t and WCK_c clock signals may be used by the device to generate internal clock signals for timing the operation of circuits to receive the write data. The data is provided by the controller 130 and the device receives the write data according to the WCK_t and WCK_c clock signals, which is written to memory corresponding to the memory addresses.

As indicated above, FIG. 2 is provided as an example. Other examples may differ from what is described with regard to FIG. 2.

Figure 3:
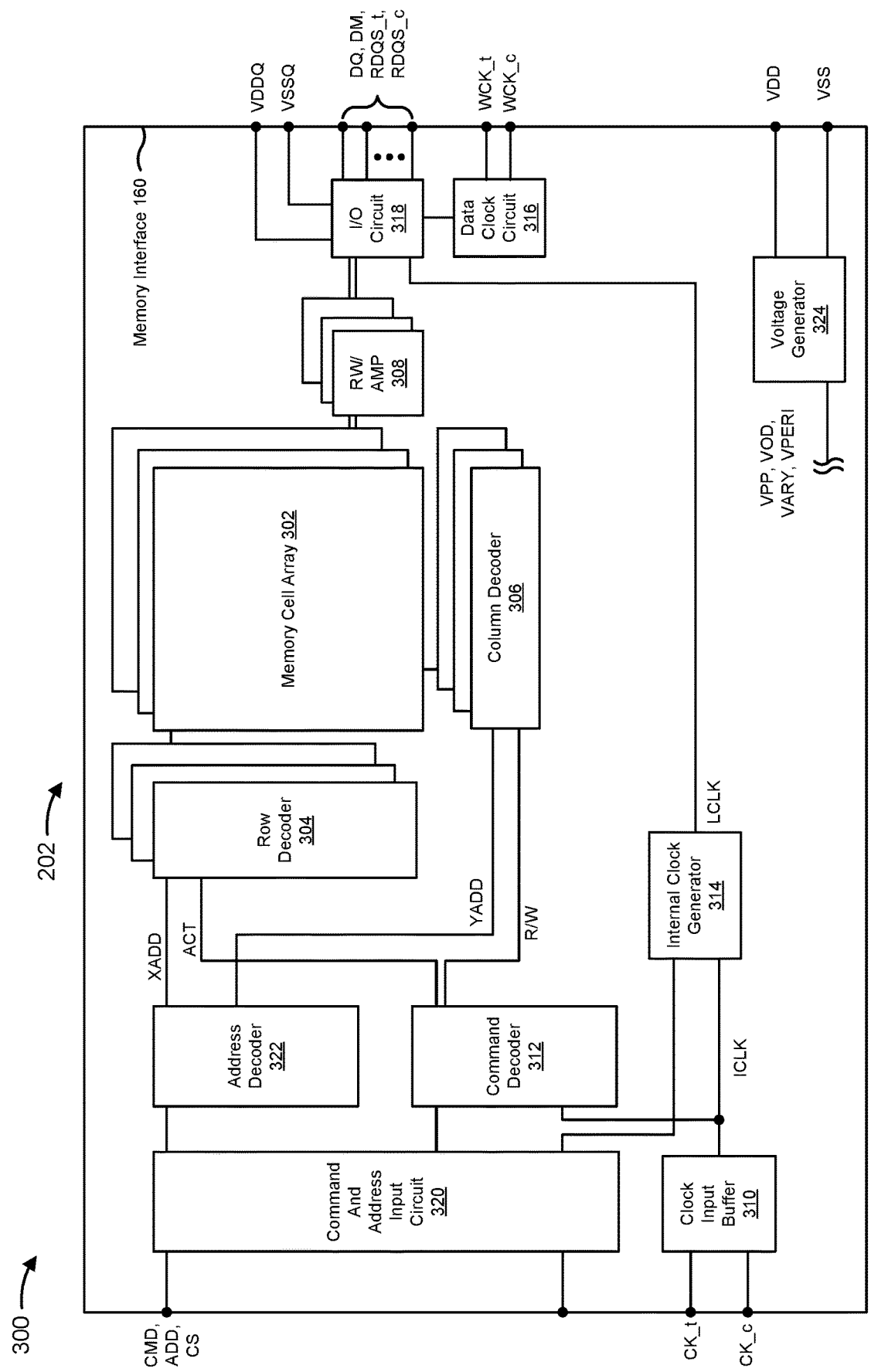
FIG. 3 is a diagram of an example implementation of a device described herein.

FIG. 3 is a diagram of an example implementation 300 of a device 202 described herein. The device 202 may correspond to one or more of the devices 202a-202n of the memory 140 of the memory device 120 described herein.

The device 202 may include one or more memory cell arrays 302. Each of the memory cell arrays 302 may include a plurality of word lines (WL), a plurality of bit lines (BL), and a plurality of memory cells (MC) arranged at intersections of the plurality of word lines and the plurality of bit lines. The selection of a word line is performed by a row decoder 304 and the selection of a bit line is performed by a column decoder 306. Respective row decoders 304 may be included for each memory cell array 302 and the respective column decoders 306 may be included for each memory cell array 302. The bit lines are coupled to respective sense amplifiers (SAMP). Read data from the bit line is amplified by a sense amplifier SAMP and transferred to read/write amplifiers (RW/AMP) 308 over complementary local data lines (LIOT/B), transfer gate (TG), and complementary main data lines (MIOT/B). Conversely, write data outputted from the read/write amplifiers 308 is transferred to the sense amplifier SAMP over the complementary main data lines MIOT/B, the transfer gate TG, and the complementary local data lines LIOT/B, and written in a memory cell coupled to the bit line.

The device 202 may include a plurality of external terminals that include command and address and chip select (CA/CS) terminals coupled to a command and address bus 204 to receive commands and addresses, and coupled to one of the select buses 210a-210n to receive a CS signal. Moreover, the external terminals may include clock terminals to receive system clock signals CK_t and CK_c and data clock signals WCK_t and WCK_c, and to provide access data clock signals RDQS_t and RDQS_c on a clock bus 208. Additionally, the external terminals may include data terminals DQ and DM connected to a data bus 206, and power supply terminals to receive power supply potentials VDD, VSS, VDDQ, and VSSQ.

The clock terminals are supplied with external system clock signals CK_t and CK_c that are provided to a clock input buffer 310. The external system clock signals may be complementary, as described above. The clock input buffer 310 generates an internal clock (ICLK) based on the CK_t and CK_c clock signals. The ICLK clock is provided to a command decoder 312 and to an internal clock generator 314. The command decoder 312 decodes commands received on the command and address bus 204 based on the ICLK clock. The internal clock generator 314 provides various internal clock signals (LCLK) based on the ICLK clock. The LCLK clock signals may be used for timing operation of various internal circuits.

Data clock signals WCK_t and WCK_c are also provided to the external clock terminals. The WCK_t and WCK_c clock signals are provided to a data clock circuit 316, which generates internal data clock signals based on the WCK_t and WCK_c clock signals. The internal data clock signals are provided to the input/output (I/O) circuit 318 for synchronizing the timing of operations of circuits included in the I/O circuit 318, for example, to data receivers to time the receipt of write data. For example, the data clock circuit 316 may generate a plurality of clock signals for access operations associated with one or more of the memory cell arrays 302.

The data clock circuit 316 may monitor and/or adjust properties of the WCK_t and WCK_c clock signals before distributing them to other components of the memory and/or generated internal data clock signals based on the WCK_t and WCK_c clock signals. In some implementations, the data clock circuit 316 may divide the WCK_t and/or the WCK_c clock signals into additional clock signals, may perform delay trimming and/or duty cycle correction for the clock signals, may perform phase distortion reduction and/or jitter reduction, and/or may perform one or more other operations.

The CA/CS terminals may be supplied with memory addresses on the command and address bus 204. The memory addresses supplied to the CA/CS terminals are transferred, via a command and address input circuit 320, to an address decoder 322. The address decoder 322 receives the address and supplies a decoded row address (XADD) to a row decoder 304 and supplies a decoded column address (YADD) to a column decoder 306. The CA/CS terminals may be supplied with commands on the command and address bus 204. Examples of commands include timing commands for controlling the timing of various operations, access commands for accessing the memory, such as read commands for performing read operations and write commands for performing write operations, mode register write and read commands for performing mode register write and read operations, as well as other commands and operations.

The commands may be provided as internal command signals to the command decoder 312 via the command and address input circuit 320. The command decoder 312 includes circuits to decode the internal command signals to generate various internal signals and commands for performing operations. For example, the command decoder 312 may provide a row command signal (ACT) to select a word line and a column command signal (R/W) to select a bit line.

When a read command is received, and a row address and a column address are timely supplied with the read command, read data is read from memory cells in the memory cell array(s) 302 corresponding to the row address and column address. The read command is received by the command decoder 312, which provides internal commands so that read data from the memory cell array(s) 302 is provided to the read/write amplifiers 308. The read data is output to outside from the data terminals DQ via the I/O circuit 318. The RDQS_t and RDQS_c clock signals are provided externally from clock terminals for timing provision of the read data by the I/O circuit 318. The external terminals DQ include several separate terminals, each providing a bit of data synchronized with a clock edge of the RDQS_t and RDQS_c clock signals. The quantity of external terminals DQ may correspond to a data width, that is, a quantity of bits of data that may be concurrently provided with a clock edge of the RDQS_t and RDQS_c clock signals. In some implementations, the data width of the device 202 may be 8 bits, 16 bits, and/or another data width.

When the write command is received, and a row address and a column address are timely supplied with the write command, write data supplied to the data terminals DQ is written to memory cells in the memory cell array(s) 302 corresponding to the row address and column address. A data mask may be provided to the data terminals DM to mask portions of the data when written to memory. The write command is received by the command decoder 312, which provides internal commands so that the write data is received by data receivers in the I/O circuit 318. WCK_t and WCK_c clock signals are also provided to the external clock terminals for timing the receipt of the write data by the data receivers of the I/O circuit 318. The write data is supplied via the I/O circuit 318 to the read/write amplifiers 308, and by the read/write amplifiers 308 to the memory cell array(s) 302 to be written into memory cell(s) of the memory cell array(s) 302. As indicated above, the external terminals DQ may include several separate terminals. With reference to a write operation, each external terminal DQ may receive a bit of data, and the quantity of external terminals DQ may correspond to a data width of bits of data that may be concurrently received synchronized with a clock edge of the WCK_t and WCK_c clock signals. In some implementations, the data width of the device 202 may be 8 bits, 16 bits, and/or another data width.

The power supply terminals are supplied with power supply potentials VDD and VSS. The power supply potentials VDD and VSS are supplied to an internal voltage generator circuit 324. The internal voltage generator circuit 324 generates various internal potentials VPP, VOD, VARY, VPERI, and the like based on the power supply potentials VDD and VSS supplied to the power supply terminals. The internal potential VPP may be primarily used in the row decoder 304, the internal potentials VOD and VARY may be primarily used in the sense amplifiers SAMP included in the memory cell arrays 302, and the internal potential VPERI may be primarily used in peripheral circuit blocks of the device 202.

The power supply terminals are also supplied with power supply potentials VDDQ and VSSQ. The power supply potentials VDDQ and VSSQ are supplied to the I/O circuit 318. The power supply potentials VDDQ and VSSQ supplied to the power supply terminals may be the same potentials as the power supply potentials VDD and VSS supplied to the power supply terminals, as an example. The power supply potentials VDDQ and VSSQ supplied to the power supply terminals may be different potentials from the power supply potentials VDD and VSS supplied to the power supply terminals. The power supply potentials VDDQ and VSSQ supplied to the power supply terminals may be used for the I/O circuit 318 so that power supply noise generated by the I/O circuit 318 does not propagate to other circuit blocks of the device 202.

As indicated above, FIG. 3 is provided as an example. Other examples may differ from what is described with regard to FIG. 3.

Figure 4A:
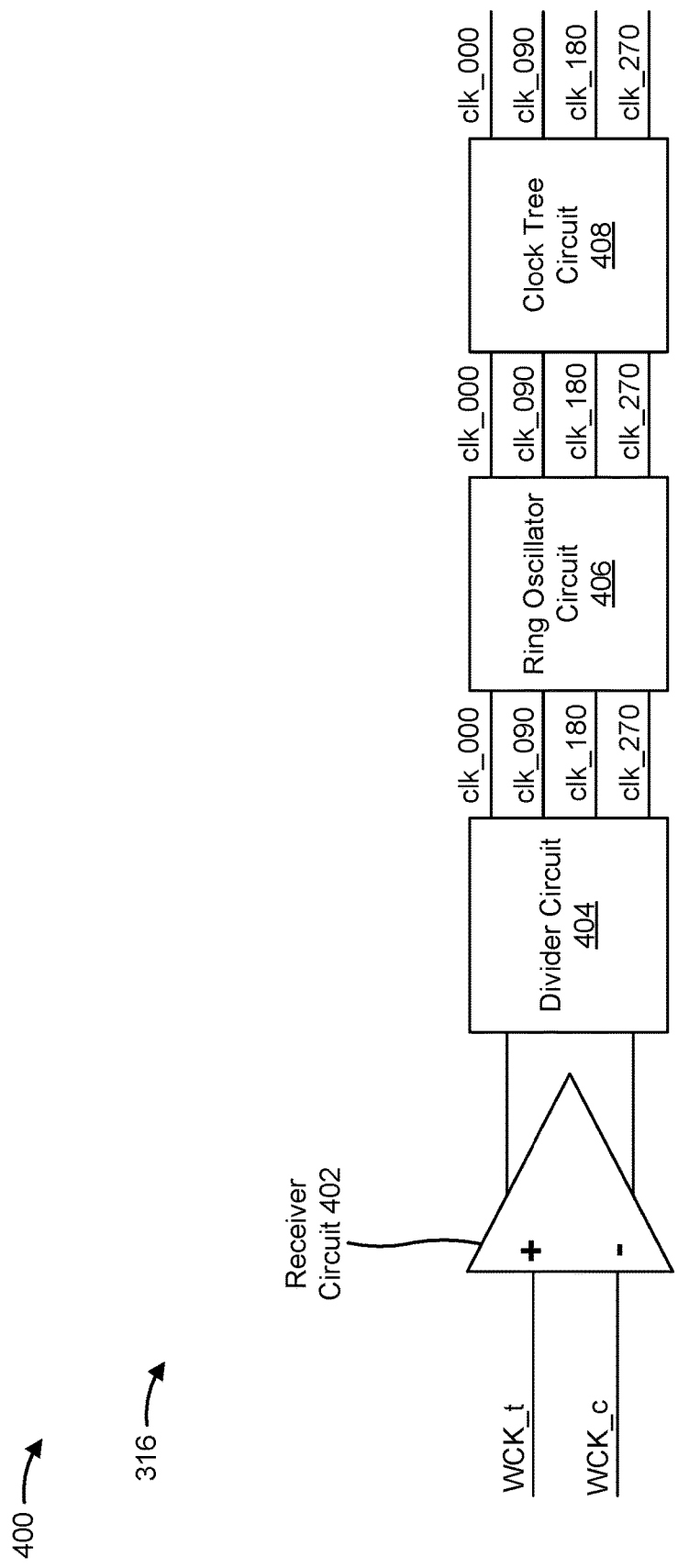
FIGS. 4A and 4B are diagrams of example implementations of a data clock circuit described herein.
Figure 4B:
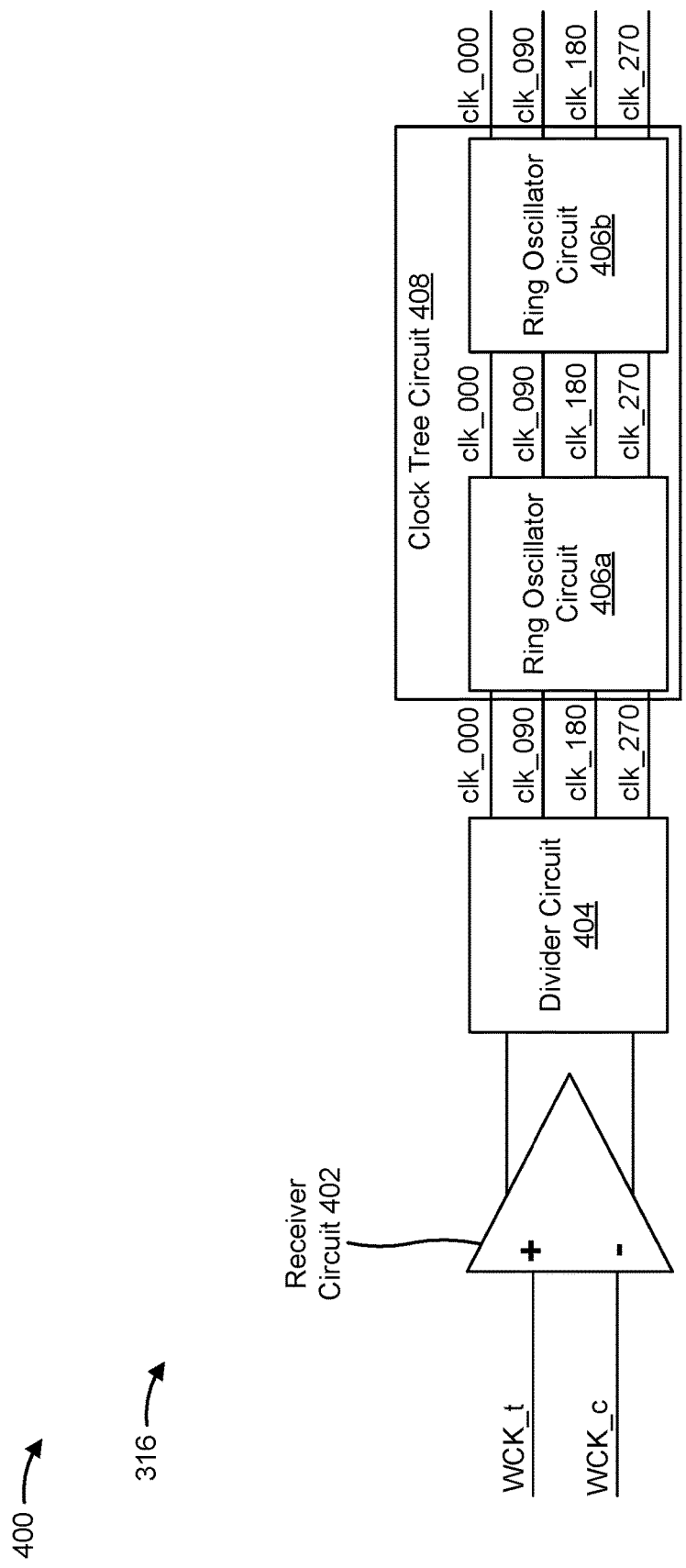

FIGS. 4A and 4B are diagrams of example implementations of a data clock circuit 316 described herein.

FIG. 4A illustrates an example implementation 400 of the data clock circuit 316. As shown in the example implementation 400 of the data clock circuit 316, the data clock circuit 316 may include a receiver circuit 402, a divider circuit 404, a ring oscillator circuit 406, and a clock tree circuit 408, among other circuits and/or components. The receiver circuit 402 may be coupled with the divider circuit 404, the divider circuit 404 may be coupled with the ring oscillator circuit 406, and the ring oscillator circuit 406 may be coupled with the clock tree circuit 408. The receiver circuit 402 may also be coupled with the clock bus 208, and the clock tree circuit 408 may be coupled with one or more other components and/or circuits of the device 202, such as the I/O circuit 318. Each of the receiver circuit 402, the divider circuit 404, the ring oscillator circuit 406, and the clock tree circuit 408 may include a combination of electrical components, such as conductive traces, metallization layers, transistors, capacitors, resistors. At least a subset of the electric components may be arranged to form logic devices, such as inverters, AND gates, and/or OR gates, among other examples.

The receiver circuit 402 may be configured to receive data clocks WCK_t and WCK_c (e.g., on the clock bus 208 over the memory interface 160) and to provide complementary output clocks. The receiver circuit 402 may be configured to provide complementary output clocks based on the data clocks WCK_t and WCK_c. The complementary output clocks may have the same clock frequency as the WCK_t and WCK_c data clocks.

The receiver circuit 402 may be configured to provide the complementary output clocks to the divider circuit 404. The divider circuit 404 may be configured to receive the complementary output clocks and to generate a plurality of phase-shifted clock signals based on the complementary output clocks. For example, the divider circuit 404 may be configured to generate multiphase clock signals clk_000, clk_090, clk_180, and clk_270. While four phase clock signals are illustrated in the example in FIG. 4, the divider circuit 404 may be configured to generate another quantity of phase-shifted clock signals.

The clk_000 clock signal, the clk_090 clock signal, the clk_180 clock signal, and the clk_270 clock signal may have phase relationships relative to one another. For example, the clk_090 clock signal may be 90 degrees out of phase (e.g., may be phase-shifted by 90 degrees) relative to the clk_000 clock signal, the clk_180 clock may be 90 degrees out of phase relative to the clk_090 clock signal, and the clk_270 clock signal may be 90 degrees out of phase relative to the clk_180 clock signal. Thus, the clk_000 clock signal and the clk_180 clock signal may be complementary clock signals in that the clk_000 clock signal and the clk_180 are 180 degrees out of phase from each other, and the clk_090 clock signal and the clk_270 clock signal may be complementary clock signals in that the clk_090 clock signal and the clk_270 are 180 degrees out of phase from each other. The clk_000 clock signal may have neighboring clock signals clk_090 and clk_270 in that the clock signals clk_090 and clk_270 are both 90 degrees out of phase with the clk_000 clock signal. The clk_090 clock signal may have neighboring clock signals clk_000 and clk_180 in that the clock signals clk_000 and clk_180 are both 90 degrees out of phase with the clk_090 clock signal. The clk_180 clock signal may have neighboring clock signals clk_090 and clk_270 in that the clock signals clk_090 and clk_270 are both 90 degrees out of phase with the clk_180 clock signal. The clk_270 clock signal may have neighboring clock signals clk_000 and clk_180 in that the clock signals clk_000 and clk_180 are both 90 degrees out of phase with the clk_270 clock signal.

The divider circuit 404 may be configured to provide the clk_000 clock signal, the clk_090 clock signal, the clk_180 clock signal, and the clk_270 clock signal to the ring oscillator circuit 406. The ring oscillator circuit 406 may be configured to receive the clk_000 clock signal, the clk_090 clock signal, the clk_180 clock signal, and the clk_270 clock signal from the divider circuit 404. In some implementations, the clk_000 clock signal, the clk_090 clock signal, the clk_180 clock signal and the clk_270 clock signal propagate through other circuits and/or components between the divider circuit 404 and the ring oscillator circuit 406, such as a plurality of inverters, buffer circuitry, and/or driver circuitry, among other examples. Re-driver circuits may be included between the divider circuit 404 and the ring oscillator circuit 406. The re-driver circuits may be configured to drive the clk_000 clock signal, the clk_090 clock signal, the clk_180 clock signal, and/or the clk_270 clock signal to achieve particular clock signal frequencies and/or data rates.

The circuits and/or components between the divider circuit 404 and the ring oscillator circuit 406 may cause phase distortion and/or jitter to occur in one or more of the clk_000 clock signal, the clk_090 clock signal, the clk_180 clock signal, and/or the clk_270 clock signal. For example, the re-driver circuits may consume large amounts of power, which may result in noise injection into the clk_000 clock signal, the clk_090 clock signal, the clk_180 clock signal, and/or the clk_270 clock signal. The phase distortion and/or jitter may include systemic phase distortion and/or systemic jitter (e.g., phase distortion and/or jitter that occurs as a result of the architecture and/or physical implementation of the data clock circuit 316), random or pseudorandom phase distortion and/or random or pseudorandom jitter (e.g., Monte-Carlo phase distortion and/or jitter), or a combination thereof.

Phase distortion in one or more of the clk_000 clock signal, the clk_090 clock signal, the clk_180 clock signal, and/or the clk_270 clock signal may result in the occurrence of phase-to-phase misalignment between two or more of the clk_000 clock signal, the clk_090 clock signal, the clk_180 clock signal, and/or the clk_270 clock signal. For example, phase distortion may result in the phase of the clk_090 clock signal drifting away from the 90 degrees set point for the clk_090 clock signal, which results in the clk_090 clock signal no longer being 90 degrees out of phase from the clk_000 clock signal and the clk_180 clock signal, and no longer being 180 degrees out of phase from the clk_270 clock signal.

Moreover, jitter (e.g., the deviation of a clock signal from the selected periodicity for the clock signal) may increase between the divider circuit 404 and the ring oscillator circuit 406, which may be referred to as jitter multiplication. For example, the input jitter distribution of the data clocks WCK_t and WCK_c as received at the receiver circuit 402 may increase by a factor that is greater than 1 by the time the clk_000 clock signal, the clk_090 clock signal, the clk_180 clock signal, and the clk_270 clock signal reach the clock tree circuit 408. Jitter multiplication may increase phase-to-phase jitter between two or more of the clk_000 clock signal, the clk_090 clock signal, the clk_180 clock signal, and/or the clk_270 clock signal.

The ring oscillator circuit 406 is configured to reduce phase distortion and/or jitter in the clk_000 clock signal, the clk_090 clock signal, the clk_180 clock signal, and the clk_270 clock signal. In particular, the ring oscillator circuit 406 is configured to average the phase distortions and/or jitter in the clk_000 clock signal, the clk_090 clock signal, the clk_180 clock signal, and the clk_270 clock signal so as to equalize the phase distortions and/or jitter across all of the clk_000 clock signal, the clk_090 clock signal, the clk_180 clock signal, and the clk_270 clock signal. In this way, the clk_000 clock signal, the clk_090 clock signal, the clk_180 clock signal, and the clk_270 clock signal that are outputted from the ring oscillator circuit 406 have approximately the same phase distortion and jitter, which reduces and/or minimizes the phase-to-phase distortions and phase-to-phase jitter between the clk_000 clock signal, the clk_090 clock signal, the clk_180 clock signal, and the clk_270 clock signal.

The ring oscillator circuit 406 may be configured to provide the clk_000 clock signal, the clk_090 clock signal, the clk_180 clock signal, and the clk_270 clock signal to the clock tree circuit 408 (e.g., after reducing the phase distortion and/or jitter in the clk_000 clock signal, the clk_090 clock signal, the clk_180 clock signal, and the clk_270 clock signal). The clock tree circuit 408 may be configured to receive the clk_000 clock signal, the clk_090 clock signal, the clk_180 clock signal, and the clk_270 clock signal and distribute the clk_000 clock signal, the clk_090 clock signal, the clk_180 clock signal, and the clk_270 clock signal to other components and/or circuits of the device 202, such as the I/O circuit 318.

FIG. 4B illustrates an example implementation 410 of the clock circuit 316. As shown in FIG. 4B, one or more ring oscillator circuits 406 may be included in the clock tree circuit 408, such as a ring oscillator circuit 406a and a ring oscillator circuit 406b. Another quantity of ring oscillator circuits 406 may be included in the clock tree circuit 408 and/or in the clock circuit 316. Ring oscillator circuit(s) 406 may be placed in the clock tree circuit 408 and/or at the end of the clock tree circuit 408 to compensate for distortions, jitter, and/or mismatches that may be accumulated by the clock tree circuit 408.

The ring oscillator circuit 406 may be placed in a different location in the data clock circuit 316 in other implementations. For example, the ring oscillator circuit 406 may be located after the clock tree circuit 408 (e.g., between the clock tree circuit 408 and the I/O circuit 318). As another example, the ring oscillator circuit 406 may be included in the clock tree circuit 408 and may be located along one or more of the conductive traces of the clock tree circuit 408.

As indicated above, FIG. 4 is provided as an example. Other examples may differ from what is described with regard to FIG. 4.

Figure 5A:
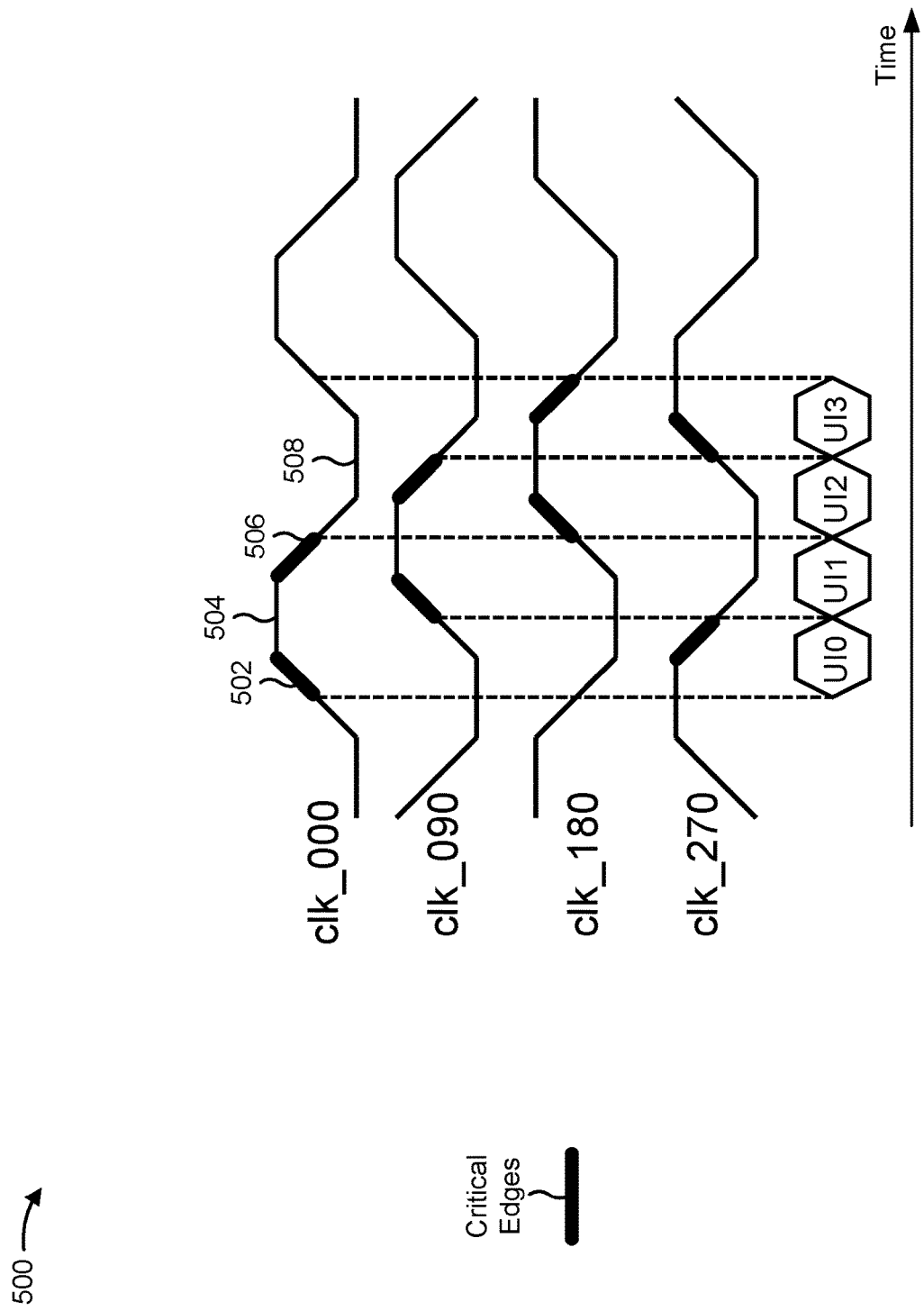
FIGS. 5A and 5B are diagrams of an example implementation of clock signals that are generated by the data clock circuit described herein.
Figure 5B:
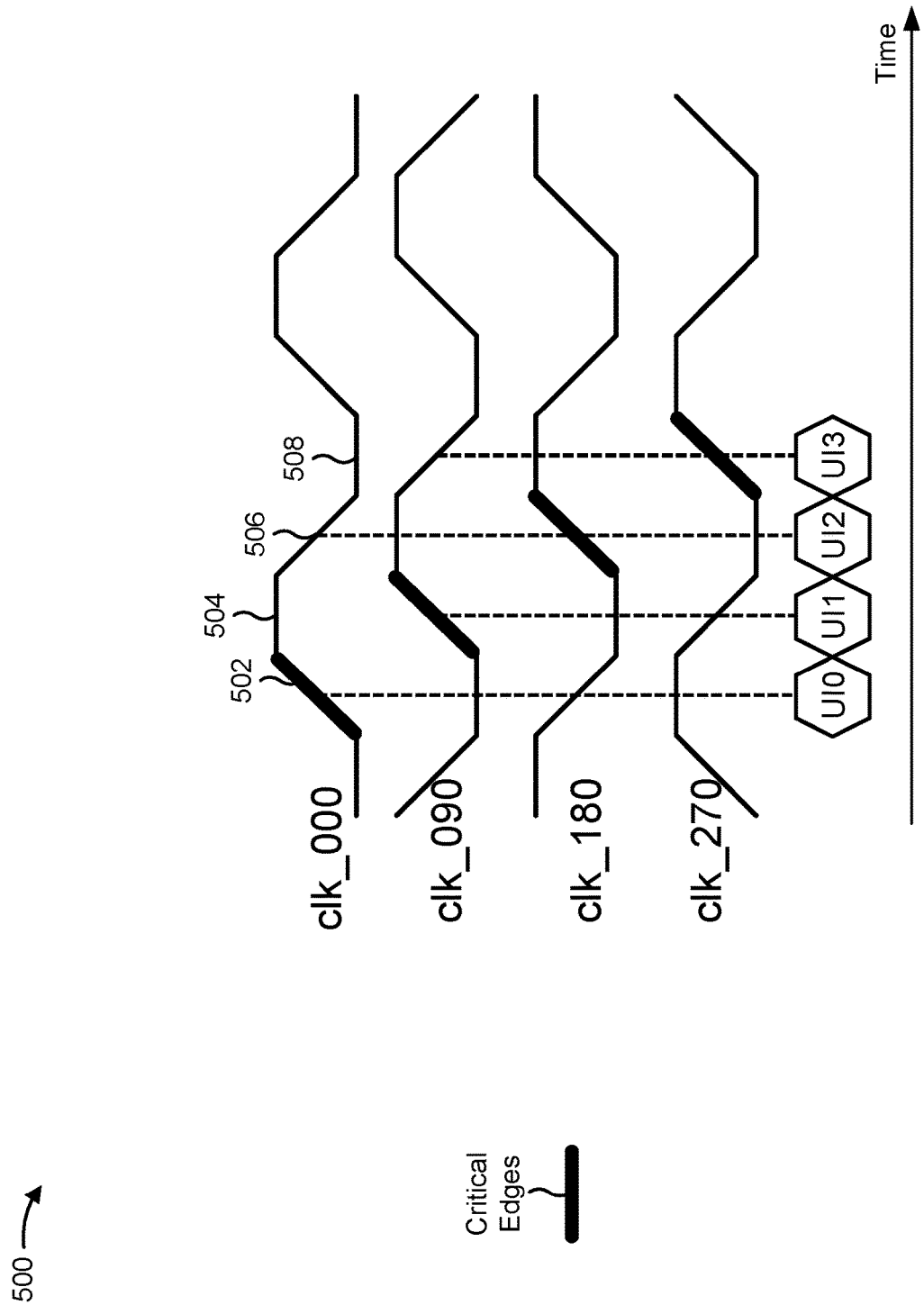

FIGS. 5A and 5B are diagrams of an example implementation 500 of clock signals that are generated by the data clock circuit 316 described herein. The example implementation 500 may include an example of four-phase clocking or quad data rate (QDR) clocking in a memory device. FIG. 5A illustrates an example of four-phase clocking for reading data, and FIG. 5B illustrates an example of four-phase clocking for writing data.

As shown in FIG. 5A, the phase offsets of the clk_000 clock signal, the clk_090 clock signal, the clk_180 clock signal, and the clk_270 clock signal results in a particular timing alignment of the clk_000 clock signal, the clk_090 clock signal, the clk_180 clock signal, and the clk_270 clock signal. Each cycle of the clk_000 clock signal, the clk_090 clock signal, the clk_180 clock signal, and the clk_270 clock signal includes a rising edge 502, a high signal 504, a falling edge 506, and a low signal 508.

The phase offsets of the clk_000 clock signal, the clk_090 clock signal, the clk_180 clock signal, and the clk_270 clock signal results in the rising edges 502 of the clk_000 clock signal, the low signals 508 of the clk_090 clock signal, the falling edges 506 of the clk_180 clock signal, and the high signals 504 of the clk_270 clock signal being timing aligned. The phase offsets of the clk_000 clock signal, the clk_090 clock signal, the clk_180 clock signal, and the clk_270 clock signal results in the high signals 504 of the clk_000 clock signal, the rising edges 502 of the clk_090 clock signal, the low signals 508 of the clk_180 clock signal, and the falling edges 506 of the clk_270 clock signal being timing aligned.

The phase offsets of the clk_000 clock signal, the clk_090 clock signal, the clk_180 clock signal, and the clk_270 clock signal results in the falling edges 506 of the clk_000 clock signal, the high signals 504 of the clk_090 clock signal, the rising edges 502 of the clk_180 clock signal, and the low signals 508 of the clk_270 clock signal being timing aligned. The phase offsets of the clk_000 clock signal, the clk_090 clock signal, the clk_180 clock signal, and the clk_270 clock signal results in the low signals 508 of the clk_000 clock signal, the falling edges 506 of the clk_090 clock signal, the high signals 504 of the clk_180 clock signal, and the rising edges 502 of the clk_270 clock signal being timing aligned.

As further shown in FIG. 5A, unit intervals (UIs) for reading data may be edge aligned to the clock signals. For example, the starting edge of a first unit interval (UI0) may be aligned with a rising edge 502 of the clk_000 clock signal, the starting edge of a second unit interval (UI1) may be aligned with a rising edge 502 of the clk_090 clock signal, the starting edge of a third unit interval (UI2) may be aligned with a rising edge 502 of the clk_180 clock signal, and the starting edge of a fourth unit interval (UI3) may be aligned with a rising edge 502 of the clk_270 clock signal.

As shown in FIG. 5B, unit intervals for writing data may be center aligned to the clock signals. For example, the center of a first unit interval (UI0) may be aligned with a rising edge 502 of the clk_000 clock signal, the center of a second unit interval (UI1) may be aligned with a rising edge 502 of the clk_090 clock signal, the center of a third unit interval (UI2) may be aligned with a rising edge 502 of the clk_180 clock signal, and the center of a fourth unit interval (UI3) may be aligned with a rising edge 502 of the clk_270 clock signal.

As described above, phase distortion and/or jitter in one or more of the clk_000 clock signal, the clk_090 clock signal, the clk_180 clock signal, and/or the clk_270 clock signal may cause phase-to-phase misalignment. Phase-to-phase misalignment may result in a shift of the rising edges 502 and/or falling edges 506 of the clk_000 clock signal, the clk_090 clock signal, the clk_180 clock signal, and the clk_270 clock signal illustrated in FIGS. 5A and 5B. The phase-to-phase misalignment may result in reduced time durations of some unit intervals for reading and/or writing data, may result in increased time durations for some unit intervals for reading and/or writing data, and/or may result in overlapping of some unit intervals for reading and/or writing data. The ring oscillator circuit 406 described herein may be configured to reduce the phase-to-phase misalignment between the clk_000 clock signal, the clk_090 clock signal, the clk_180 clock signal, and/or the clk_270 clock signal, which may reduce the likelihood of unit interval shortening, unit interval lengthening, and/or unit interval overlapping.

As indicated above, FIGS. 5A and 5B are provided as examples. Other examples may differ from what is described with regard to FIGS. 5A and 5B.

Figure 6A:
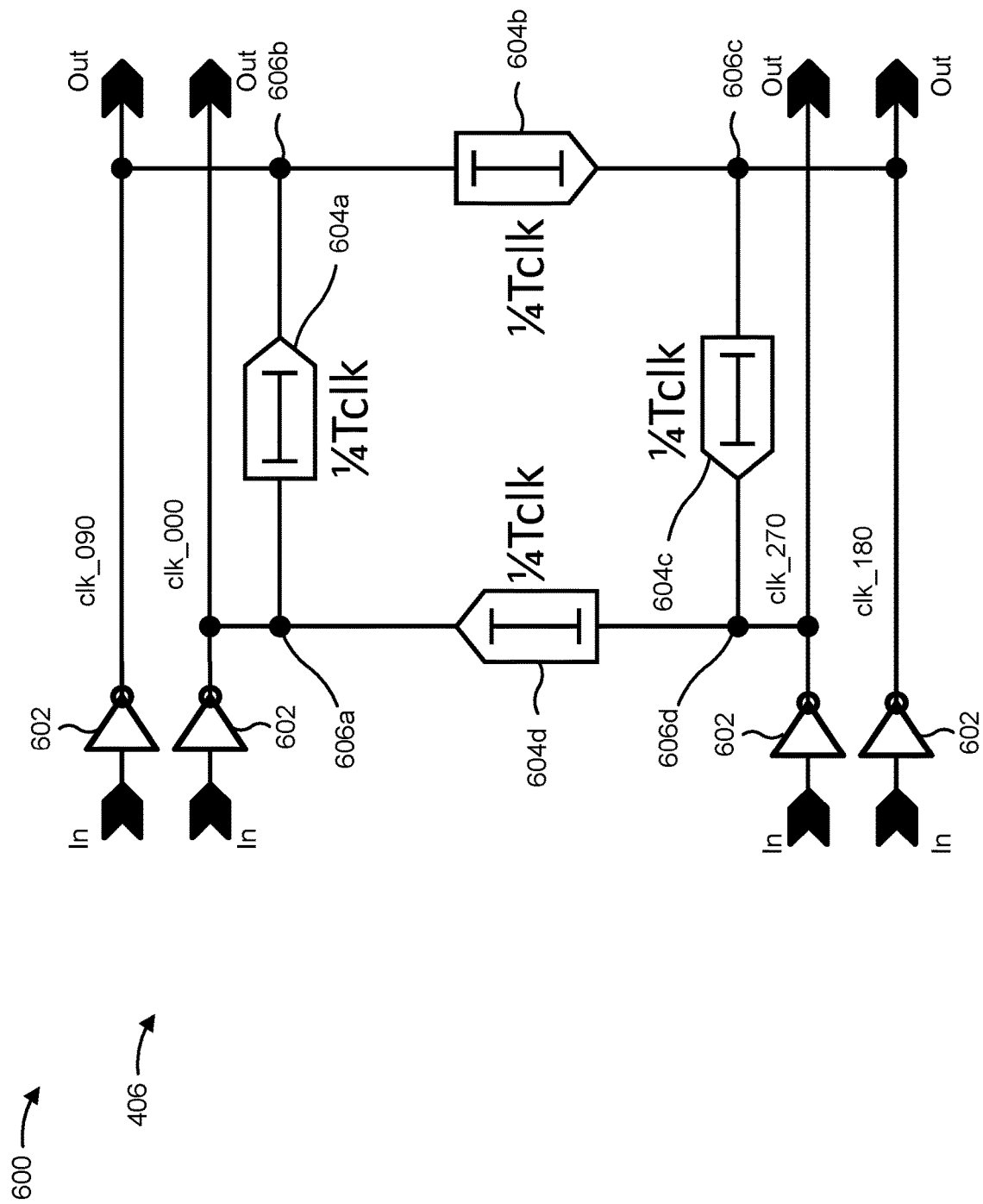
FIGS. 6A and 6B are diagrams of example implementations of the ring oscillator circuit described herein.
Figure 6B:
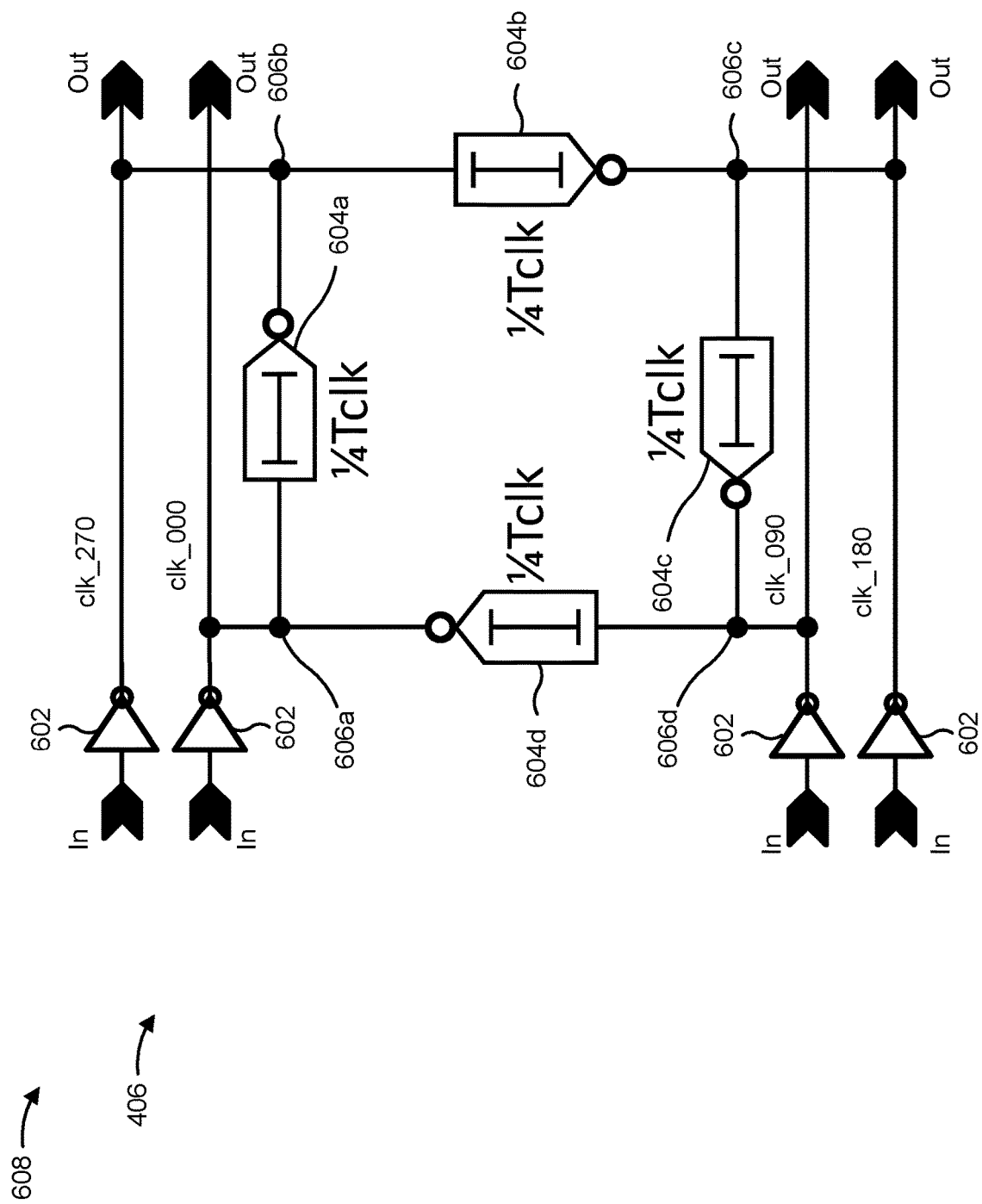

FIGS. 6A and 6B are diagrams of example implementations of the ring oscillator circuit 406 described herein.

As shown in FIG. 6A, an example implementation 600 of the ring oscillator circuit 406 includes inputs of the clk_000 clock signal, the clk_090 clock signal, the clk_180 clock signal, and the clk_270 clock signal. The clk_000 clock signal, the clk_090 clock signal, the clk_180 clock signal, and the clk_270 clock signal may each propagate through one or more inverters 602 prior to entering the ring oscillator circuit 406.

The phases of the clk_000 clock signal, the clk_090 clock signal, the clk_180 clock signal, and the clk_270 clock signal may each have approximately the same duty cycle (e.g., 50% duty cycle or another duty cycle). The delay between neighboring phases of the clk_000 clock signal, the clk_090 clock signal, the clk_180 clock signal, and the clk_270 clock signal may be $\frac{1}{4}^{th}$ of the clock period (Tclk) of the clk_000 clock signal, the clk_090 clock signal, the clk_180 clock signal, and the clk_270 clock signal. The ring oscillator circuit 406 may include a plurality of delay components 604a-604d that are connected in series and arranged in a ring shape. Each of the delay components 604a-604d may delay the incoming propagating signals by $\frac{1}{4}^{th}$ of the clock period (Tclk) of the clk_000 clock signal, the clk_090 clock signal, the clk_180 clock signal, and the clk_270 clock signal.

Each of the clk_000 clock signal, the clk_090 clock signal, the clk_180 clock signal, and the clk_270 clock signal may enter the ring oscillator circuit 406 at a respective node. The clk_000 clock signal may enter and exit the ring oscillator circuit 406 at a node 606a, and may propagate through the ring oscillator circuit 406 in the order of the delay component 604a, the delay component 604b, the delay component 604c, and the delay component 604d. The clk_090 clock signal may enter and exit the ring oscillator circuit 406 at a node 606b, and may propagate through the ring oscillator circuit 406 in the order of the delay component 604b, the delay component 604c, the delay component 604d, and the delay component 604a.

The clk_180 clock signal may enter and exit the ring oscillator circuit 406 at a node 606c, and may propagate through the ring oscillator circuit 406 in the order of the delay component 604c, the delay component 604d, the delay component 604a, and the delay component 604b. The clk_270 clock signal may enter and exit the ring oscillator circuit 406 at a node 606d, and may propagate through the ring oscillator circuit 406 in the order of the delay component 604d, the delay component 604a, the delay component 604b, and the delay component 604c.

The clk_000 clock signal, the clk_090 clock signal, the clk_180 clock signal, and the clk_270 clock signal may interact or interpolate in the ring oscillator circuit 406 as the clk_000 clock signal, the clk_090 clock signal, the clk_180 clock signal, and the clk_270 clock signal propagate through the delay components 604a-604d. The interaction or interpolation couples the clk_000 clock signal, the clk_090 clock signal, the clk_180 clock signal, and the clk_270 clock signal with neighboring (or orthogonal) phases of the clk_000 clock signal, the clk_090 clock signal, the clk_180 clock signal, and the clk_270 clock signal. Each of the clk_000 clock signal, the clk_090 clock signal, the clk_180 clock signal, and the clk_270 clock signal may interpolate with multiple phase-delayed versions of the other clock signals of the clk_000 clock signal, the clk_090 clock signal, the clk_180 clock signal, and the clk_270 clock signal. For example, the clk_000 clock signal may interpolate with delayed versions of the clk_090 clock signal, delayed versions of the clk_180 clock signal, and delayed versions of the clk_270 clock signal. Interpolation may occur in a similar manner for the clk_090 clock signal, the clk_180 clock signal, and the clk_270 clock signal.

Moreover, each of the clk_000 clock signal, the clk_090 clock signal, the clk_180 clock signal, and the clk_270 clock signal may self-interpolate with multiple phase-delayed versions of the clk_000 clock signal, the clk_090 clock signal, the clk_180 clock signal, and the clk_270 clock signal. For example, the clk_000 clock signal may interpolate with delayed versions of the clk_000 clock signal as the clk_000 clock signal continually enters the ring oscillator circuit 406 and becomes increasingly delayed by the delay components 604a-604d. Self-interpolation may occur in a similar manner for the clk_090 clock signal, the clk_180 clock signal, and the clk_270 clock signal. Thus, the ring oscillator circuit 406 may function as an infinite response filter in which a clock signal may recirculate an infinitely long time providing interpolation with multiple periods of the clock signal.

The interaction or interpolation (and self-interpolation) of the clk_000 clock signal, the clk_090 clock signal, the clk_180 clock signal, and the clk_270 clock signal results in the interpolation of phase distortions, jitter, and/or other clock parameters of the clk_000 clock signal, the clk_090 clock signal, the clk_180 clock signal, and the clk_270 clock signal, which averages the phase distortions, jitter, and/or other clock parameters over time as the clk_000 clock signal, the clk_090 clock signal, the clk_180 clock signal, and the clk_270 clock signal propagate through the ring oscillation circuit 406. The resulting clk_000 clock signal, clk_090 clock signal, clk_180 clock signal, and clk_270 clock signal that are outputted from the ring oscillation circuit 406 have approximately equalized phase distortions, jitter, and/or other clock parameters, which may reduce phase-to-phase distortion, duty cycle variation, and/or phase-to-phase jitter among the clk_000 clock signal, the clk_090 clock signal, the clk_180 clock signal, and the clk_270 clock signal.

As shown in FIG. 6B, an example implementation 608 of the ring oscillator circuit 406. The example implementation 608 is similar to the example implementation, except that the delay components 604a-604d are inverted delay components in the example implementation 608. Moreover, the inputs on which the clk_090 clock signal and the clk_270 clock signal enter the ring of delay components 604a-604d is reversed relative to the example implementation 600. The use of inverted delay components in the ring oscillator circuit 406 may enable equalization of phase distortions, jitter, and/or other clock parameters when the delay is inverting.

As indicated above, FIG. 6 is provided as an example. Other examples may differ from what is described with regard to FIG. 6.

Figure 7:
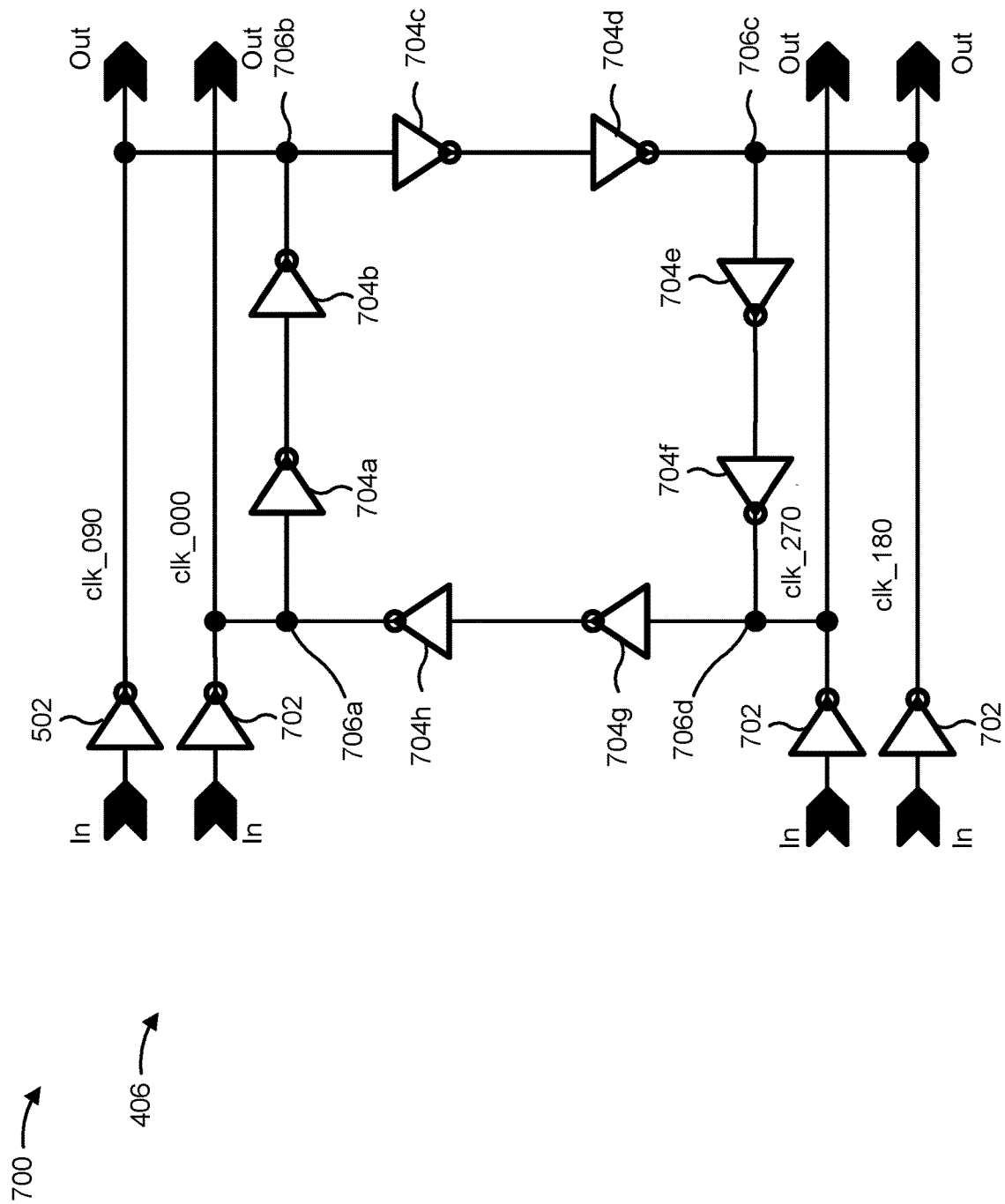
FIG. 7 is a diagram of an example implementation of the ring oscillator circuit described herein.

FIG. 7 is a diagram of an example implementation 700 of the ring oscillator circuit 406 described herein.

As shown in FIG. 7, the clk_000 clock signal, the clk_090 clock signal, the clk_180 clock signal, and the clk_270 clock signal may propagate through one or more inverters 702 and into the ring oscillator circuit 406. As further shown in FIG. 7, the delay components 604a-604d may be implemented by a chain of inverters 704a-704h such that the clk_000 clock signal, the clk_090 clock signal, the clk_180 clock signal, and the clk_270 clock signal are coupled through the inverters 704a-704h in the ring oscillator circuit 406. Inverters 704a and 704b may be located between nodes 706a and 706b (and may correspond to the delay component 604a), inverters 704c and 704d may be located between nodes 706b and 706c (and may correspond to the delay component 604b), inverters 704e and 704f may be located between nodes 706c and 706d (and may correspond to the delay component 604c), and inverters 704g and 704h may be located between nodes 706d and 706a (and may correspond to the delay component 604d).

Accordingly, neighboring clock signals may be phase delayed by two (or more) inverters in the ring oscillator circuit 406.

Each node of the ring oscillation circuit 406 may have a particular rise time and/or a particular fall time and opposing polarity. The interaction between the phases of the clk_000 clock signal, the clk_090 clock signal, the clk_180 clock signal, and the clk_270 clock signal may be visible in cases where each pair of inverters (e.g., inverters 704a and 704b, inverters 704c and 704d, inverters 704e and 704f, and inverters 704g and 704h) coincides with approximately $\frac{1}{4}^{th}$ the operating frequency (Tclk) of the clk_000 clock signal, the clk_090 clock signal, the clk_180 clock signal, and the clk_270 clock signal. In these cases, the edges (e.g., the rising edges 502, the falling edges 506) of the incoming and delayed versions of the clk_000 clock signal, the clk_090 clock signal, the clk_180 clock signal, and the clk_270 clock signal may interact, meaning that the example implementation 700 of the ring oscillator circuit 406 may be capable of operating across a relatively wide frequency range (e.g., approximately 1 gigahertz (GHz) or greater).

As indicated above, FIG. 7 is provided as an example. Other examples may differ from what is described with regard to FIG. 7.

Figure 8A:
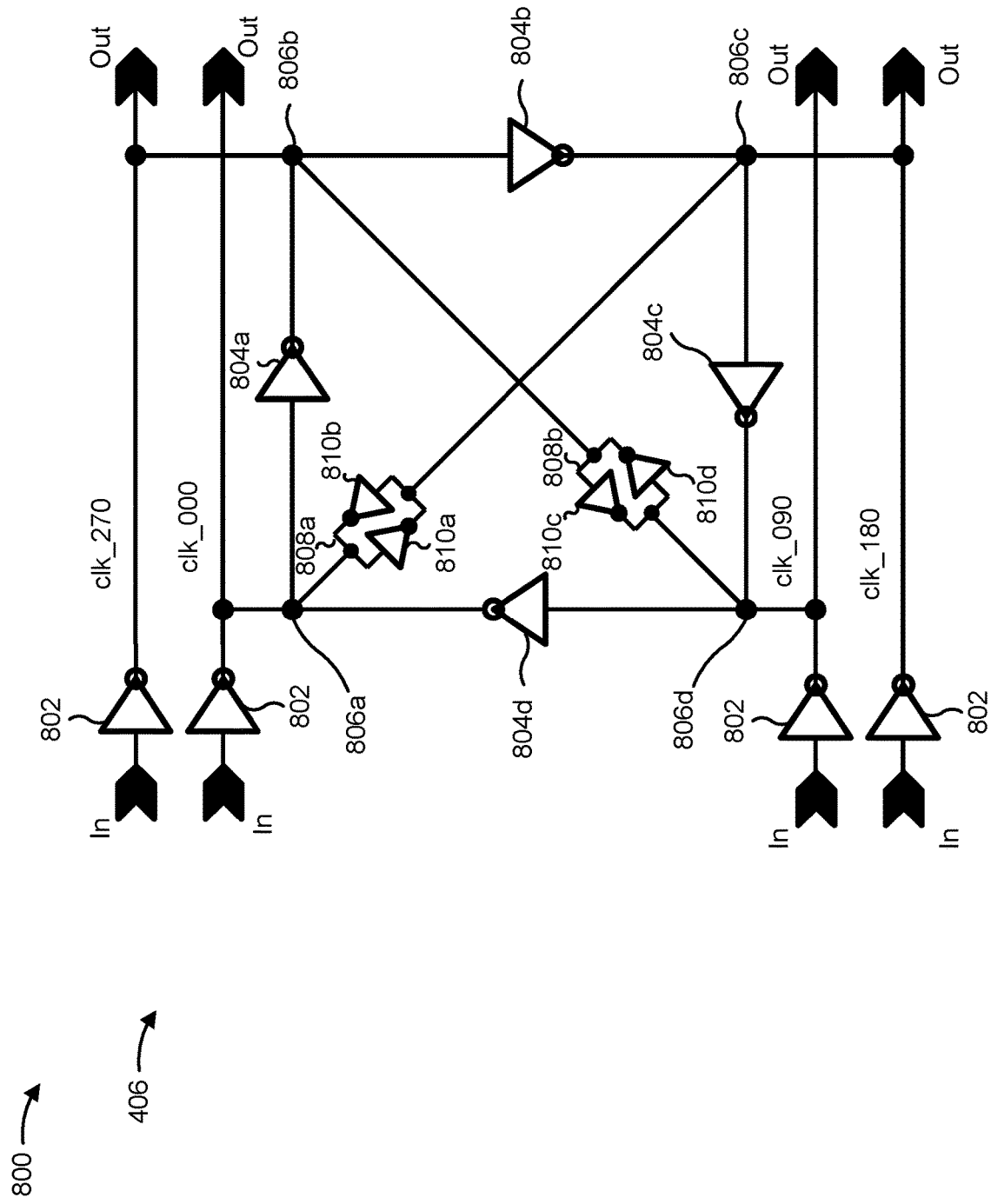
FIGS. 8A and 8B are diagrams of an example implementation of the ring oscillator circuit described herein.
Figure 8B:
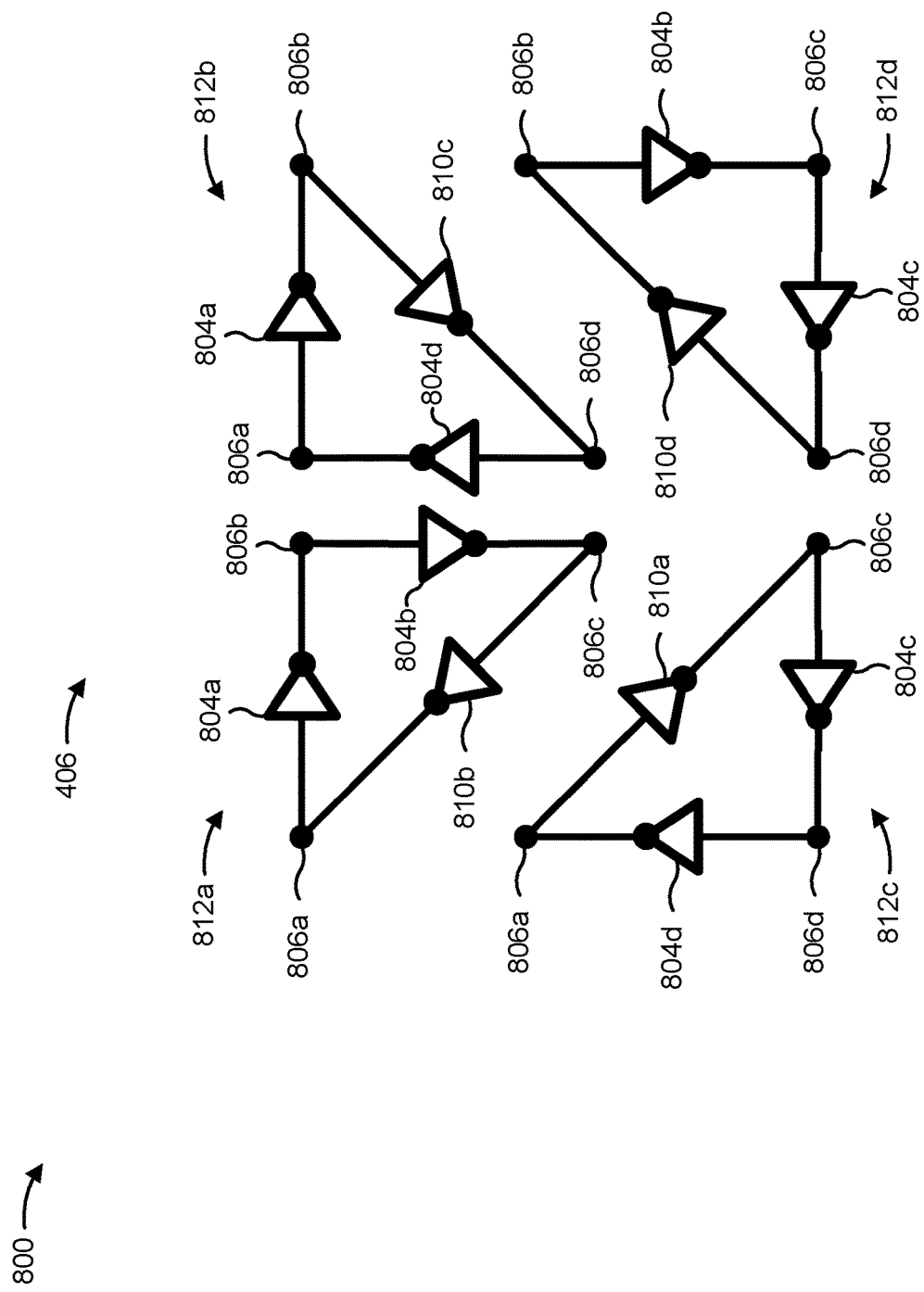

FIGS. 8A and 8B are diagrams of an example implementation 800 of the ring oscillator circuit 406 described herein. The example implementation 800 of the ring oscillator circuit 406 is similar to the example implementation 700 of the ring oscillator circuit 406, except that the example implementation 800 of the ring oscillator circuit 406 includes additional inverters that are arranged as a plurality of counter-connected inverter pairs. The addition of the plurality of counter-connected inverter pairs provides additional coupling loops or rings for interpolation of the clk_000 clock signal, the clk_090 clock signal, the clk_180 clock signal, and the clk_270 clock signal (and thus, for averaging and equalization of the associated clock parameters), which may enable the ring oscillator circuit 406 to operate in a lower frequency range relative to the example implementation 700 of the ring oscillator circuit 406.

As shown in FIG. 8A, the clk_000 clock signal, the clk_090 clock signal, the clk_180 clock signal, and the clk_270 clock signal may propagate through one or more inverters 802 and into the ring oscillator circuit 406. Inverters 804a-804d of the ring oscillator circuit 406 may be connected in series in a ring structure. The clk_000 clock signal, the clk_270 clock signal, the clk_180 clock signal, and the clk_090 clock signal may enter and exit the ring oscillator circuit 406 at respective nodes 806a-806d.

Pairs 808a and 808b of counter-connected inverters may be connected to two or more of the nodes 806a-806d. For example, the pair 808a of counter-connected inverters 810a and 810b may be connected to the node 806a and the node 806c, and the pair 808b of counter-connected inverters 810c and 810d may be connected to the node 806b and 806d. In some implementations, the quantity of inverters 804a-806d and/or the quantity of pairs 808a and 808b of counter-connected inverters may be selected based on an intended or desired operating frequency range for the data clock circuit 316. In some implementations, the arrangement of the example implementation 800 of the ring oscillator circuit 406 may enable operation in a 6 GHz operating frequency range.

As shown in FIG. 8B, the resulting configuration for the example implementation 800 of the ring oscillator circuit 406 includes a plurality of coupled ring oscillators that each include an inverter loop. The implementation 800 of the ring oscillator circuit 406 includes four ring oscillators 812a-812d, and therefore may be referred to as a four-phase ring oscillator circuit in which each of the coupled ring oscillators is connected to three of the nodes 806a-806d. Each of the ring oscillators 812a-812d may include three inverters. The ring oscillators 812a-812d may be configured to average systemic phase distortions and random phase distortions of the clk_000 clock signal, the clk_090 clock signal, the clk_180 clock signal, and the clk_270 clock signal to equalize the systemic phase distortions and random phase distortions for reducing and/or minimizing phase-to-phase mismatch between the clk_000 clock signal, the clk_090 clock signal, the clk_180 clock signal, and the clk_270 clock signal. Moreover, the ring oscillators 812a-812d may be configured to reduce phase-to-phase jitter between the clk_000 clock signal, the clk_090 clock signal, the clk_180 clock signal, and the clk_270 clock signal.

As an example, a ring oscillator 812a may be connected to nodes 806a-806c and may include inverters 804a, 804b, and 810b connected in series. The clk_000 clock signal may be directly coupled to the ring oscillator 812a at the node 806a, the clk_270 clock signal may be directly coupled to the ring oscillator 812a at the node 806b, and the clk_180 clock signal may be directly coupled to the ring oscillator 812a at the node 806c. The other clock signal(s) may be indirectly coupled to the ring oscillator 812a.

As another example, a ring oscillator 812b may be connected to nodes 806a, 806b, and 806d and may include inverters 804a, 804d, and 810c connected in series. The clk_000 clock signal may be directly coupled to the ring oscillator 812b at the node 806a, the clk_270 clock signal may be directly coupled to the ring oscillator 812b at the node 806b, and the clk_090 clock signal may be directly coupled to the ring oscillator 812b at the node 806d. The other clock signal(s) may be indirectly coupled to the ring oscillator 812b.

As another example, a ring oscillator 812c may be connected to nodes 806a, 806c, and 806d, and may include inverters 810a, 804c, and 804d connected in series. The clk_000 clock signal may be directly coupled to the ring oscillator 812c at the node 806a, the clk_180 clock signal may be directly coupled to the ring oscillator 812c at the node 806c, and the clk_090 clock signal may be directly coupled to the ring oscillator 812c at the node 806d. The other clock signal(s) may be indirectly coupled to the ring oscillator 812c.

As another example, a ring oscillator 812d may be connected to nodes 806b-806d, and may include inverters 804b, 804c, and 810d connected in series. The clk_270 clock signal may be directly coupled to the ring oscillator 812d at the node 806b, the clk_180 clock signal may be directly coupled to the ring oscillator 812d at the node 806c, and the clk_090 clock signal may be directly coupled to the ring oscillator 812d at the node 806d. The other clock signal(s) may be indirectly coupled to the ring oscillator 812d.

As indicated above, FIGS. 8A and 8B are provided as an example. Other examples may differ from what is described with regard to FIGS. 8A and 8B.

Figure 9A:
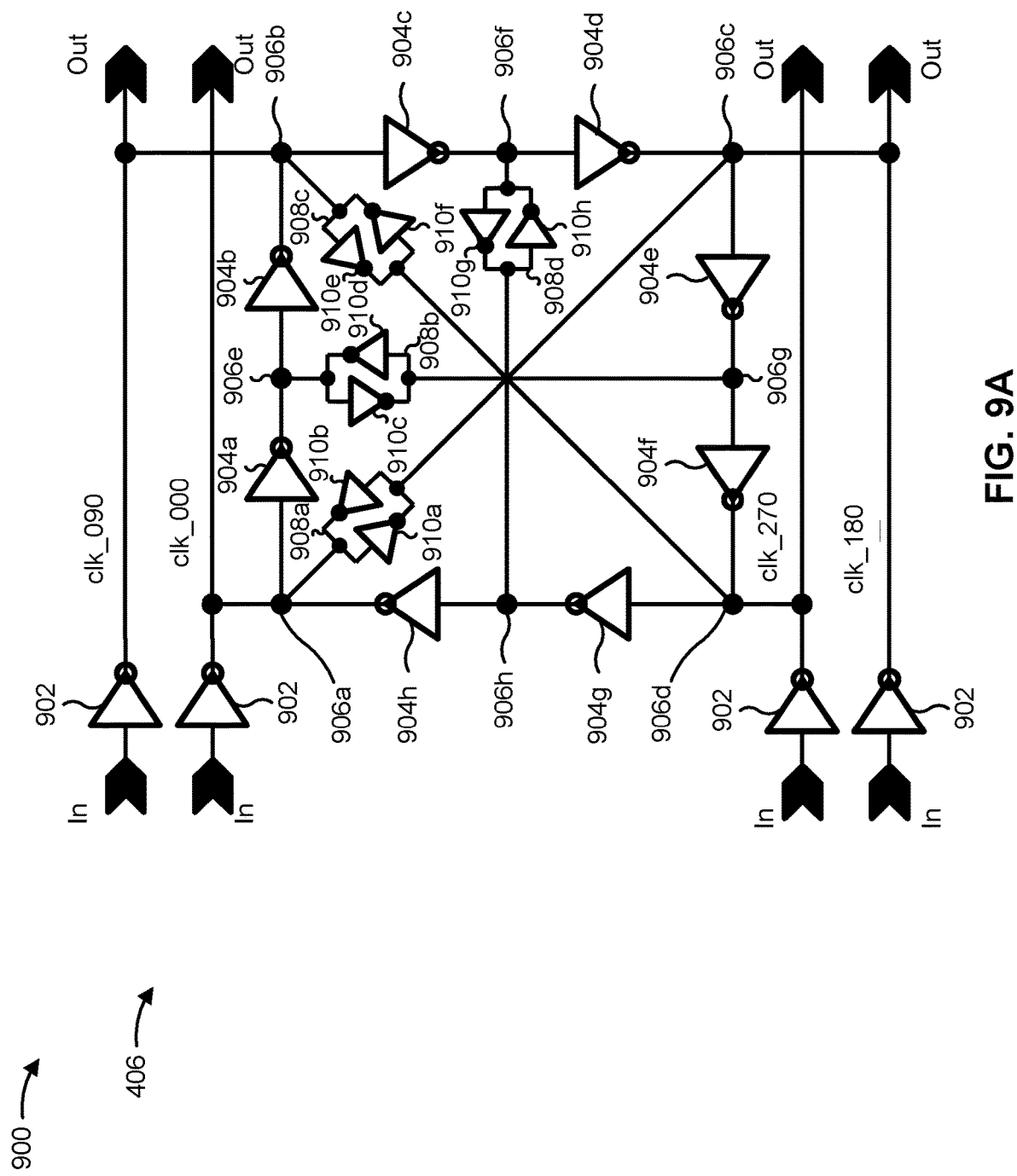
FIGS. 9A and 9B are diagrams of an example implementation of the ring oscillator circuit described herein.
Figure 9B:
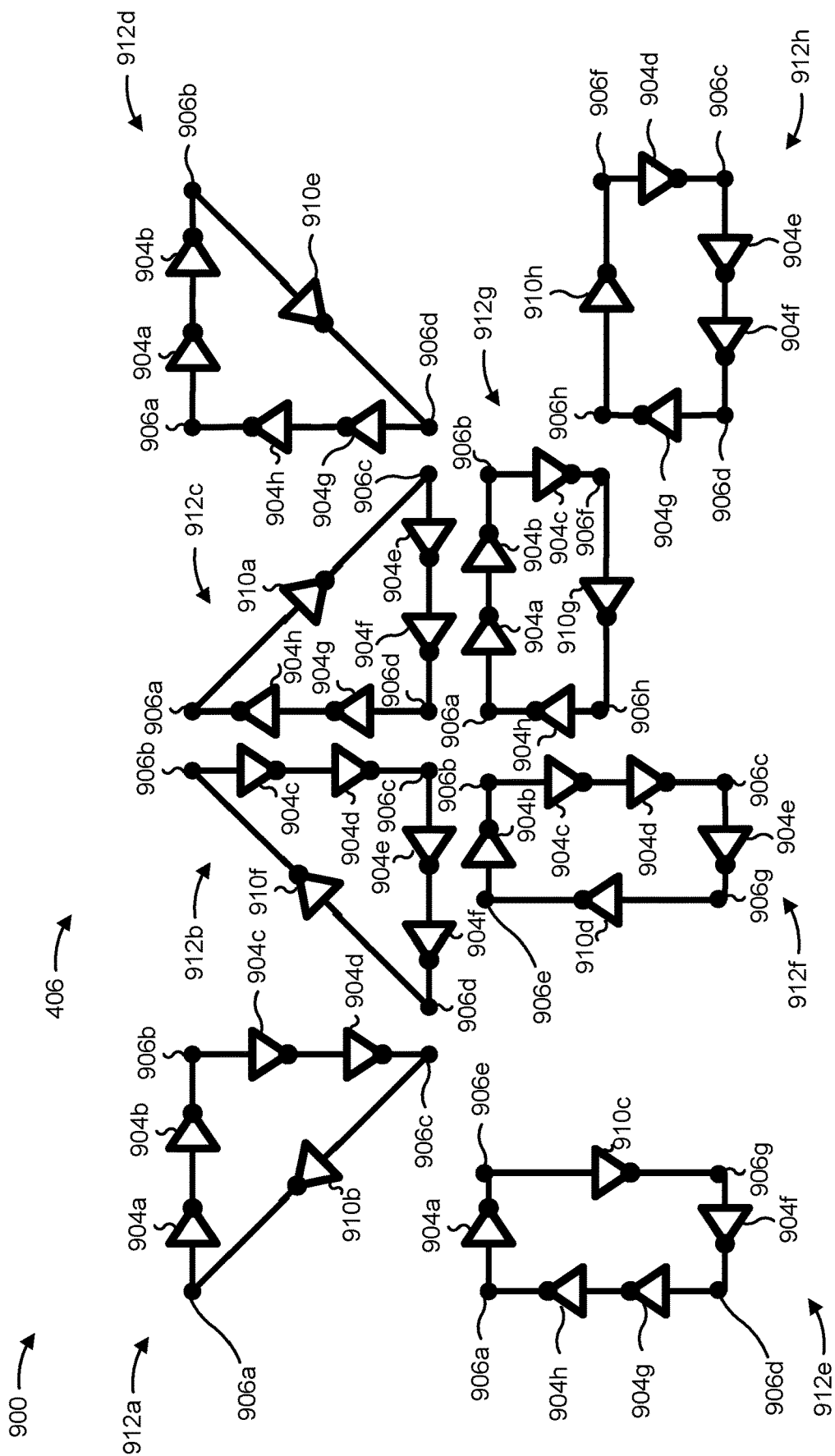

FIGS. 9A and 9B are diagrams of an example implementation 900 of the ring oscillator circuit 406 described herein. The example implementation 900 of the ring oscillator circuit 406 is similar to the example implementation 800 of the ring oscillator circuit 406, except that the example implementation 900 of the ring oscillator circuit 406 includes additional inverters and additional pairs of counter-connected inverters. The additional inverters and the additional pairs of counter-connected inverters provide additional coupling loops or rings for interpolation of the clk_000 clock signal, the clk_090 clock signal, the clk_180 clock signal, and the clk_270 clock signal (and thus, for averaging and equalization of the associated clock parameters), which may enable the ring oscillator circuit 406 to operate in a lower frequency range relative to the example implementation 800 of the ring oscillator circuit 406.

As shown in FIG. 9A, the clk_000 clock signal, the clk_090 clock signal, the clk_180 clock signal, and the clk_270 clock signal may propagate through one or more inverters 902 and into the ring oscillator circuit 406. Inverters 904a-904h of the ring oscillator circuit 406 may be connected in series in a ring structure. The clk_000 clock signal, the clk_090 clock signal, the clk_180 clock signal, and the clk_270 clock signal may enter and exit the ring oscillator circuit 406 at respective nodes 906a-906d. The external nodes 906a-906d may be referred to as external nodes of the ring oscillator circuit 406 in that the external nodes 906a-906d are directly coupled with one of the clk_000 clock signal, the clk_090 clock signal, the clk_180 clock signal, and the clk_270 clock signal.

Intermediate nodes 906e-906h (e.g., nodes that are not directly coupled with one of the clk_000 clock signal, the clk_090 clock signal, the clk_180 clock signal, and the clk_270 clock signal) may be located between two of the inverters 904a-904h. For example, the intermediate node 906e may be located between the inverters 904a and 904b. As another example, the intermediate node 906f may be located between the inverters 904c and 904d. As another example, the intermediate node 906g may be located between the inverters 904e and 904f. As another example, the intermediate node 906h may be located between the inverters 904g and 904h.

Pairs 908a-908d of counter-connected inverters may be connected to two or more of the nodes 906a-906h. For example, the pair 908a of counter-connected inverters 910a and 910b may be connected to the external node 906a and the external node 906c. As another example, the pair 908b of counter-connected inverters 910c and 910d may be connected to the intermediate node 906e and the intermediate node 906g. As another example, the pair 908c of counter-connected inverters 910e and 910f may be connected to the external node 906b and the external node 906d. As another example, the pair 908d of counter-connected inverters 910g and 910h may be connected to the intermediate node 906f and the intermediate node 906h.

In some implementations, the quantity of inverters 904a-906h and/or the quantity of pairs 908a-908d of counter-connected inverters may be selected based on an intended or desired operating frequency range for the data clock circuit 316. In some implementations, the arrangement of the example implementation 900 of the ring oscillator circuit 406 may enable operation in a 4 GHz operating frequency range.

As shown in FIG. 9B, the resulting configuration for the example implementation 900 of the ring oscillator circuit 406 includes a plurality of coupled ring oscillators that each include an inverter loop. The implementation 900 of the ring oscillator circuit 406 includes eight ring oscillators 912a-912h, and therefore may be referred to as an eight-phase ring oscillator circuit in which each of the coupled ring oscillators is connected to three or four of the nodes 906a-906h. Each of the ring oscillators 912a-912h may include five inverters. The ring oscillators 912a-912h may be configured to average systemic phase distortions and random phase distortions of the clk_000 clock signal, the clk_090 clock signal, the clk_180 clock signal, and the clk_270 clock signal to equalize the systemic phase distortions and random phase distortions for reducing and/or minimizing phase-to-phase mismatch between the clk_000 clock signal, the clk_090 clock signal, the clk_180 clock signal, and the clk_270 clock signal. Moreover, the ring oscillators 912a-912h may be configured to reduce phase-to-phase jitter between the clk_000 clock signal, the clk_090 clock signal, the clk_180 clock signal, and the clk_270 clock signal.

A ring oscillator 912a may be connected to external nodes 906a-906c and may include inverters 904a-904d and 910b connected in series. The clk_000 clock signal may be directly coupled to the ring oscillator 912a at the external node 906a, the clk_090 clock signal may be directly coupled to the ring oscillator 912a at the external node 906b, and the clk_180 clock signal may be directly coupled to the ring oscillator 912a at the external node 906c. The other clock signal(s) may be indirectly coupled to the ring oscillator 912a.

A ring oscillator 912b may be connected to external nodes 906b-906d and may include inverters 904c-904f and 910f connected in series. The clk_090 clock signal may be directly coupled to the ring oscillator 912b at the external node 906b, the clk_180 clock signal may be directly coupled to the ring oscillator 912b at the external node 906c, and the clk_270 clock signal may be directly coupled to the ring oscillator 912b at the external node 906d. The other clock signal(s) may be indirectly coupled to the ring oscillator 912b.

A ring oscillator 912c may be connected to external nodes 906a, 906c, and 906d, and may include inverters 904e-904h and 910a connected in series. The clk_000 clock signal may be directly coupled to the ring oscillator 912c at the external node 906a, the clk_180 clock signal may be directly coupled to the ring oscillator 912c at the external node 906c, and the clk_270 clock signal may be directly coupled to the ring oscillator 912c at the external node 906d. The other clock signal(s) may be indirectly coupled to the ring oscillator 912c.

As another example, a ring oscillator 912d may be connected to external nodes 906a, 906b, and 906d, and may include inverters 904a, 904b, 904g, 904h, and 910e connected in series. The clk_000 clock signal may be directly coupled to the ring oscillator 912d at the external node 906a, the clk_090 clock signal may be directly coupled to the ring oscillator 912d at the external node 906b, and the clk_270 clock signal may be directly coupled to the ring oscillator 912d at the external node 906d. The other clock signal(s) may be indirectly coupled to the ring oscillator 912d.

As another example, a ring oscillator 912e may be connected to external node 906a, external node 906d, intermediate node 906e, and intermediate node 906g, and may include inverters 904a, 904f, 904g, 904h, and 910c connected in series. The clk_000 clock signal may be directly coupled to the ring oscillator 912e at the external node 906a, and the clk_270 clock signal may be directly coupled to the ring oscillator 912e at the external node 906d. The other clock signal(s) may be indirectly coupled to the ring oscillator 912e.

As another example, a ring oscillator 912f may be connected to external node 906b, external node 906c, intermediate node 906e, and intermediate node 906g, and may include inverters 904b-904e, and 910d connected in series. The clk_090 clock signal may be directly coupled to the ring oscillator 912f at the external node 906b, and the clk_180 clock signal may be directly coupled to the ring oscillator 912f at the external node 906c. The other clock signal(s) may be indirectly coupled to the ring oscillator 912f.

As another example, a ring oscillator 912g may be connected to external node 906a, external node 906b, intermediate node 906f, and intermediate node 906g, and may include inverters 904a-904c, 904h, and 910g connected in series. The clk_000 clock signal may be directly coupled to the ring oscillator 912g at the external node 906a, and the clk_090 clock signal may be directly coupled to the ring oscillator 912g at the external node 906b. The other clock signal(s) may be indirectly coupled to the ring oscillator 912g.

As another example, a ring oscillator 912h may be connected to external node 906c, external node 906d, intermediate node 906f, and intermediate node 906h, and may include inverters 904d-904g and 910h connected in series. The clk_180 clock signal may be directly coupled to the ring oscillator 912h at the external node 906c, and the clk_270 clock signal may be directly coupled to the ring oscillator 912g at the external node 906d. The other clock signal(s) may be indirectly coupled to the ring oscillator 912g.

As indicated above, FIGS. 9A and 9B are provided as an example. Other examples may differ from what is described with regard to FIGS. 9A and 9B.

Figure 10:
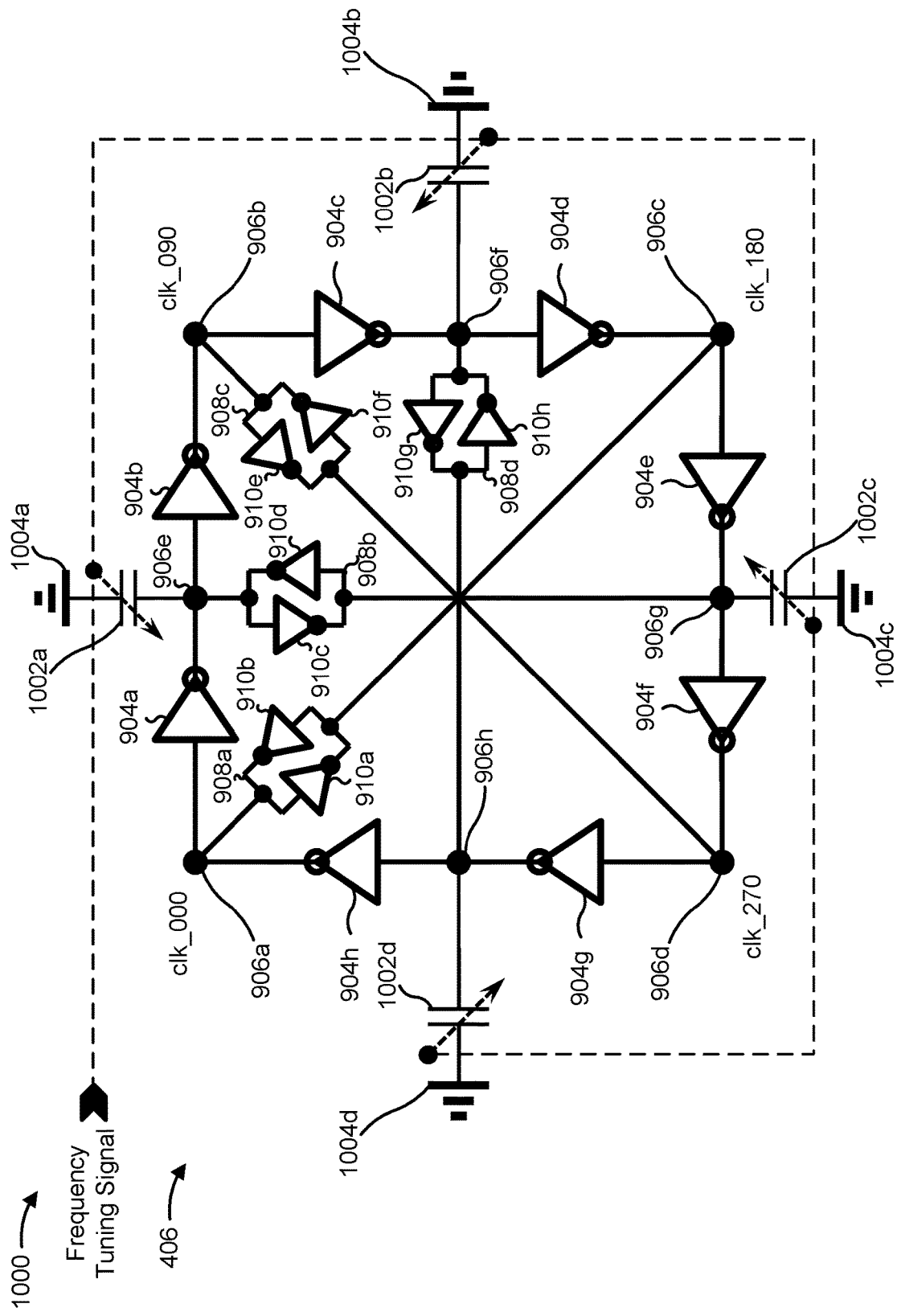
FIG. 10 is a diagram of an example implementation of the ring oscillator circuit described herein.

FIG. 10 is a diagram of an example implementation 1000 of the ring oscillator circuit 406 described herein. The example implementation 1000 of the ring oscillator circuit 406 is similar to the example implementation 900 of the ring oscillator circuit 406, except that the example implementation 1000 of the ring oscillator circuit 406 includes capacitors 1002a-1002d coupled to respective intermediate nodes 906e-906h of the ring oscillator circuit 406.

The capacitors 1002a-1002d are coupled to respective grounds 1004a-1004d. The capacitors 1002a-1002d may include variable capacitors and are otherwise configured to enable modification or frequency tuning of the frequency (e.g., the operating frequency range or the resonance frequency range) of the ring oscillator circuit 406. For example, increasing the capacitance of the capacitors 1002a-1002d may reduce the resonant frequency of the ring oscillator circuit 406, which may enable increased performance of the ring oscillator circuit 406 at lower latencies. As another example, decreasing the capacitance of the capacitors 1002a-1002d may increase the resonant frequency of the ring oscillator circuit 406, which may enable increased performance of the ring oscillator circuit 406 at higher latencies.

As indicated above, FIG. 10 is provided as an example. Other examples may differ from what is described with regard to FIG. 10.

Figure 11:
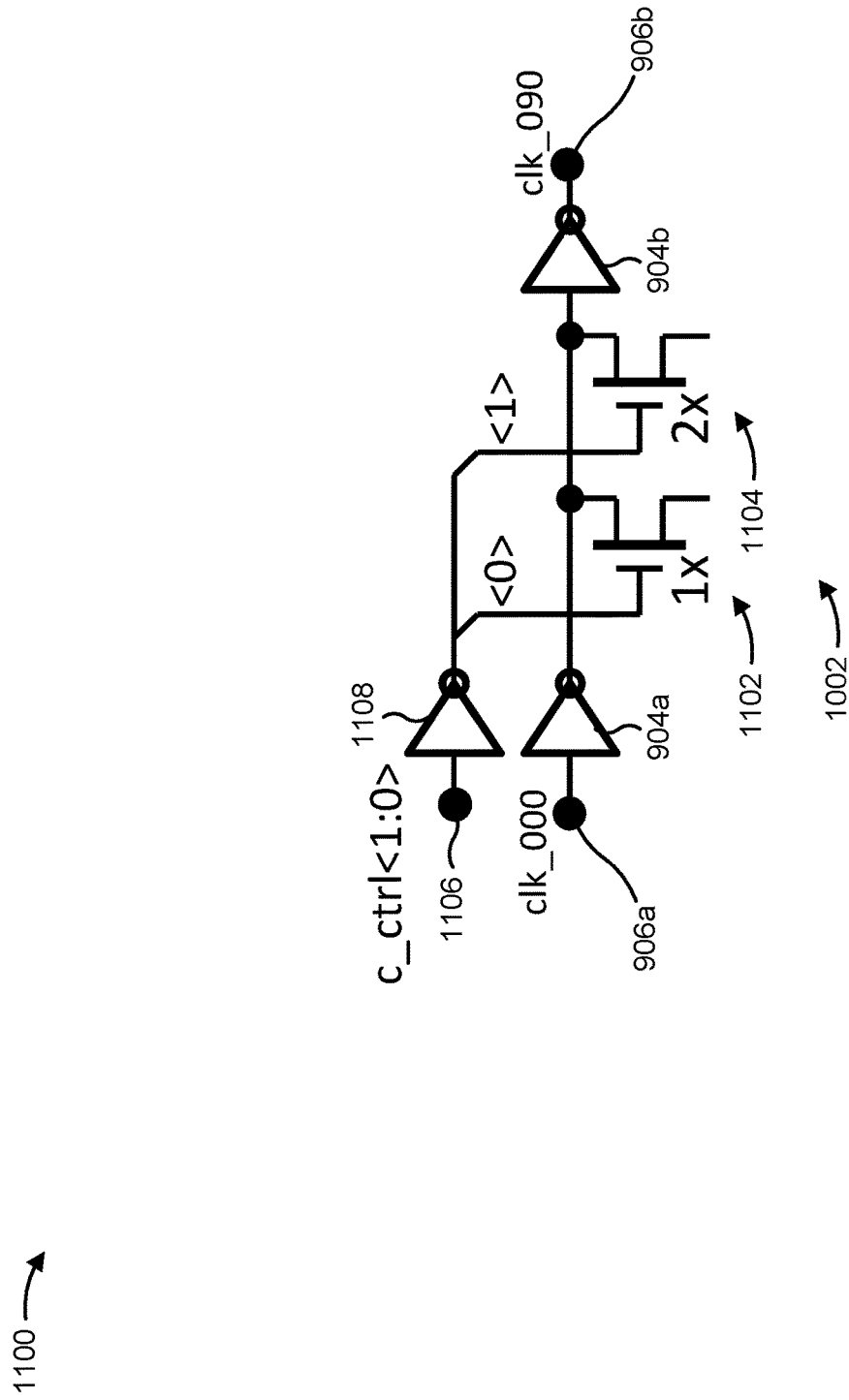
FIG. 11 is a diagram of an example implementation described herein.

FIG. 11 is a diagram of an example implementation 1100 described herein. The example implementation 1100 includes an example of a capacitor 1002 that can be used to implement one or more of the capacitors 1002a-1002d for frequency tuning in the ring oscillator circuit 406.

As shown in FIG. 11, the capacitor 1002 may include a pair of binary coded transistors 1102 and 1104. The capacitance of the capacitor 1002 may be controlled by providing binary control signals to the gates of the transistors 1102 and 1104. The binary control signals may be provided to a 2-bit wide input 1106 and through 2 inverters 1108 to the gates of the transistors 1102 and 1104. The 2-bit input and 2 inverters enable separate control of each of the gates of the transistors 1102 and 1104. Modifying or changing the values of the binary control signals may be performed to change the capacitance of the capacitor 1002.

As indicated above, FIG. 11 is provided as an example. Other examples may differ from what is described with regard to FIG. 11.

Figure 12:
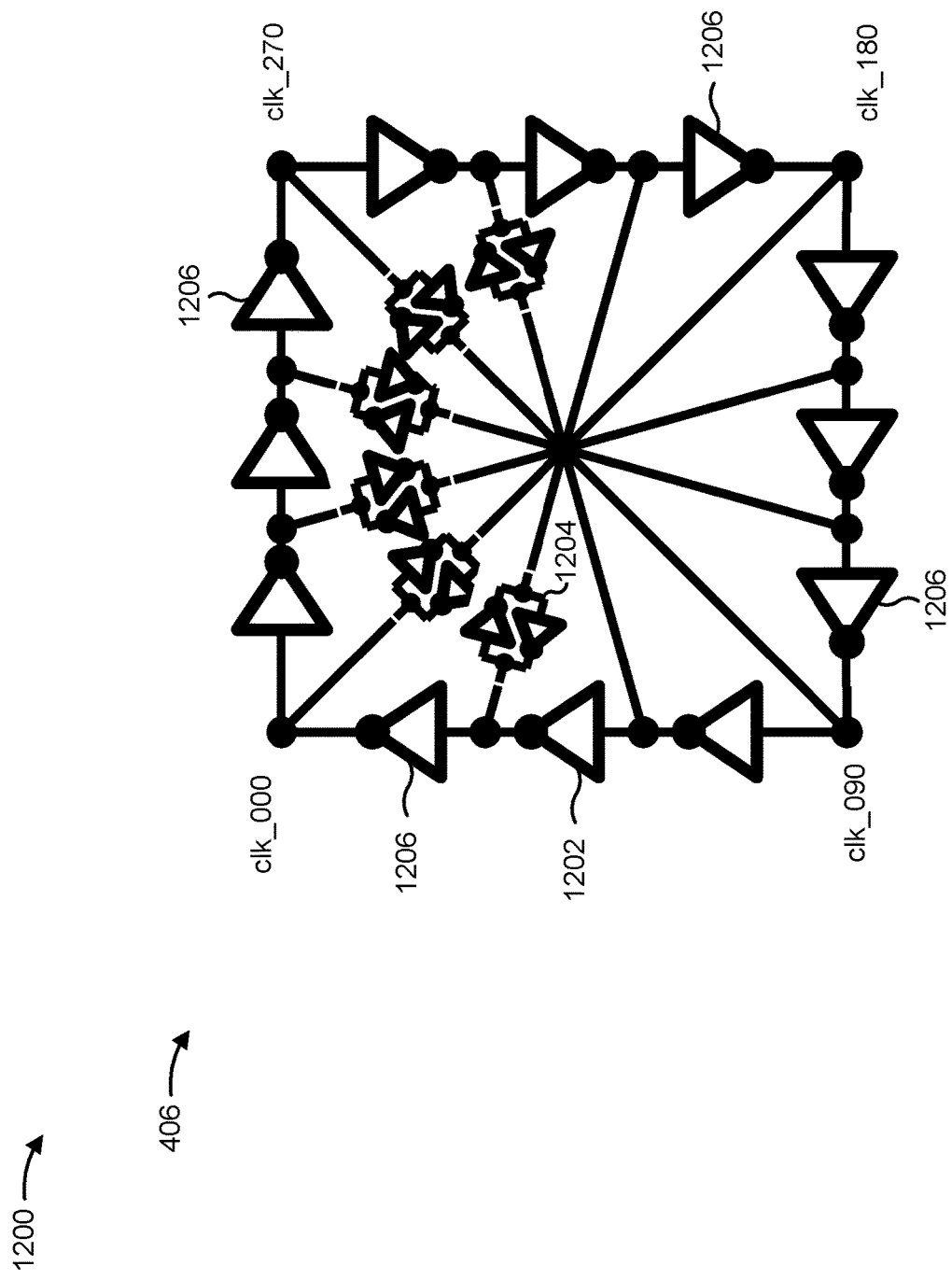
FIG. 12 is a diagram of an example implementation of the ring oscillator circuit described herein.

FIG. 12 is a diagram of an example implementation 1200 of the ring oscillator circuit 406 described herein. The example implementation 1200 of the ring oscillator circuit 406 is similar to the example implementation 900 of the ring oscillator circuit 406, except that the example implementation 1200 of the ring oscillator circuit 406 includes additional inverters and additional pairs of counter-connected inverters. The additional inverters and the additional pairs of counter-connected inverters provide additional coupling loops or rings for interpolation of the clk_000 clock signal, the clk_090 clock signal, the clk_180 clock signal, and the clk_270 clock signal (and thus, for averaging and equalization of the associated clock parameters), which may enable the ring oscillator circuit 406 to operate in a lower frequency range relative to the example implementation 900 of the ring oscillator circuit 406. In some implementations, the arrangement of inverters 1202 and pairs 1204 of counter-connected inverters in the example implementation 1200 of the ring oscillator circuit 406 may enable operation in a 3 GHz operating frequency range. In some implementations, inverters 1206 (e.g., the last inverters at the end of each segment of the ring structure) may be converted to a tristate inverter to disable the ring oscillator circuit 406.

As indicated above, FIG. 12 is provided as an example. Other examples may differ from what is described with regard to FIG. 12.

Figure 13:
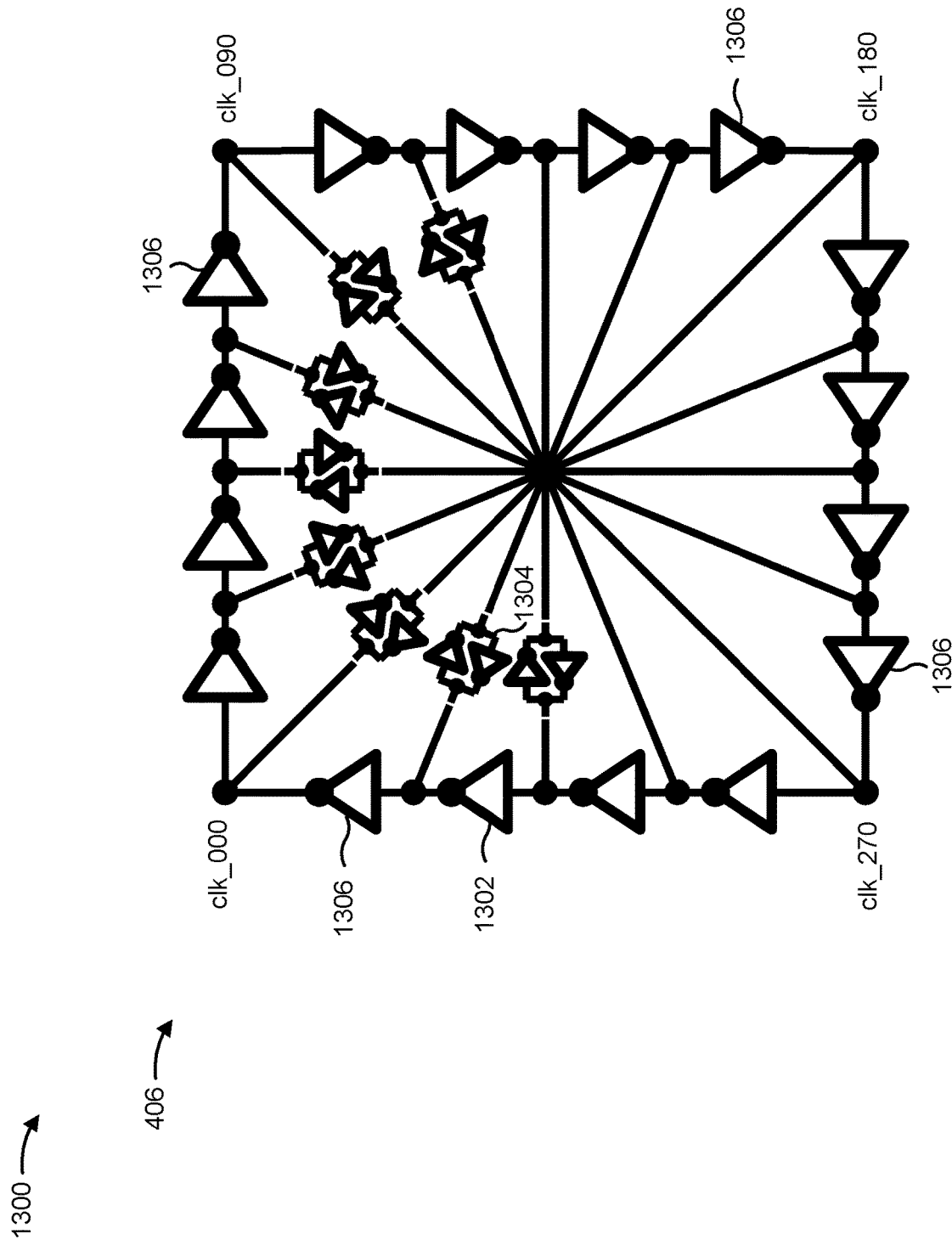
FIG. 13 is a diagram of an example implementation of the ring oscillator circuit described herein.

FIG. 13 is a diagram of an example implementation 1300 of the ring oscillator circuit 406 described herein. The example implementation 1300 of the ring oscillator circuit 406 is similar to the example implementation 1200 of the ring oscillator circuit 406, except that the example implementation 1300 of the ring oscillator circuit 406 includes additional inverters and additional pairs of counter-connected inverters. The additional inverters and the additional pairs of counter-connected inverters provide additional coupling loops or rings for interpolation of the clk_000 clock signal, the clk_090 clock signal, the clk_180 clock signal, and the clk_270 clock signal (and thus, for averaging and equalization of the associated clock parameters), which may enable the ring oscillator circuit 406 to operate in a lower frequency range relative to the example implementation 1200 of the ring oscillator circuit 406. In some implementations, the arrangement of inverters 1302 and pairs 1304 of counter-connected inverters in the example implementation 1300 of the ring oscillator circuit 406 may enable operation in a 2 GHz operating frequency range. In some implementations, inverters 1306 (e.g., the last inverters at the end of each segment of the ring structure) may be converted to a tristate inverter to disable the ring oscillator circuit 406.

As indicated above, FIG. 13 is provided as an example. Other examples may differ from what is described with regard to FIG. 13.

Figure 14:
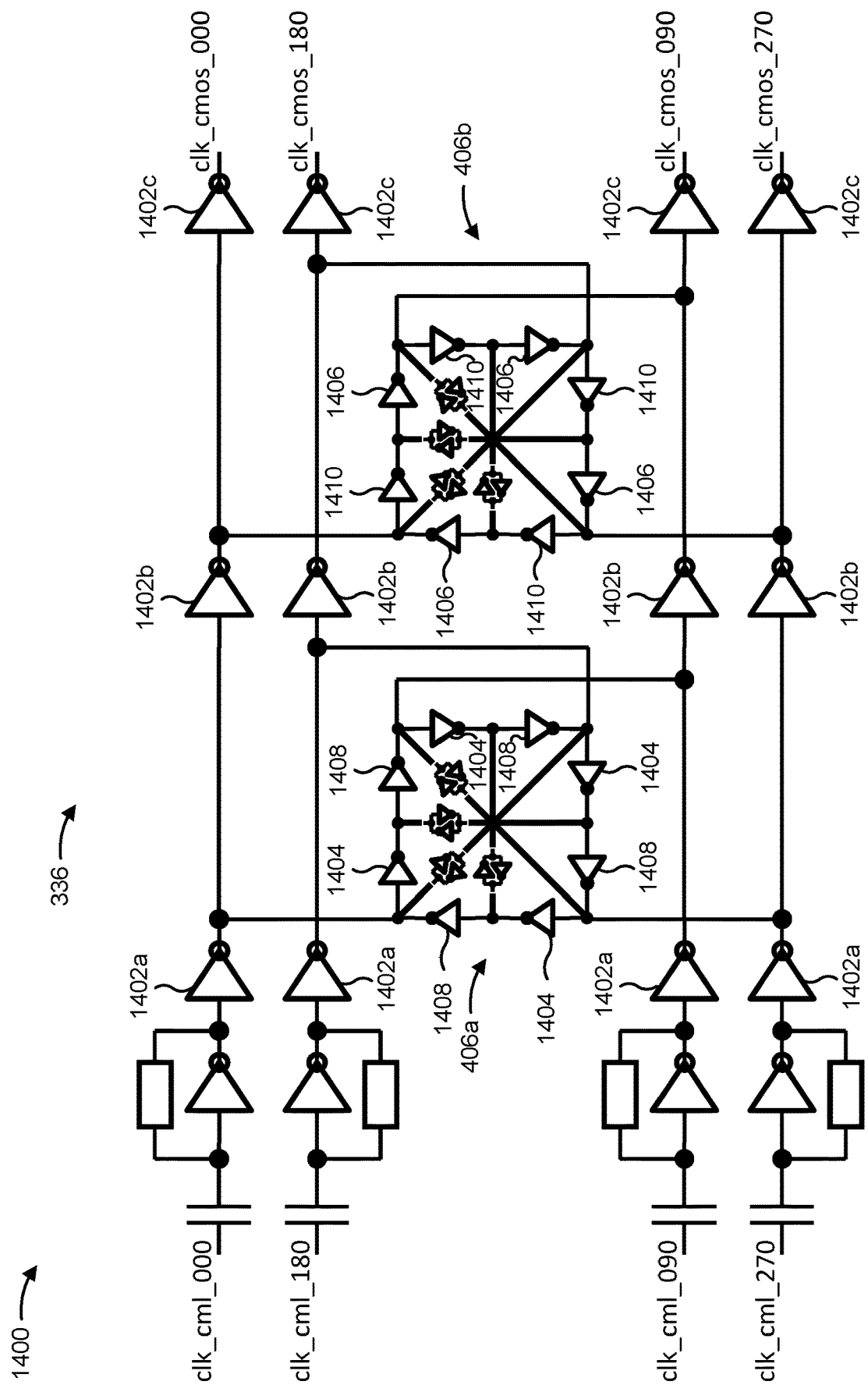
FIG. 14 is a diagram of an example implementation described herein.

FIG. 14 is a diagram of an example implementation 1400 described herein. The implementation 1400 includes an example in which a plurality of ring oscillator circuits 406 (e.g., a ring oscillator circuit 406a and a ring oscillator circuit 406b) are included in the data clock circuit 336. Including a plurality of ring oscillator circuits 406 in the data clock circuit 336 may provide additional coupling loops or rings for interpolation of the clk_000 clock signal, the clk_090 clock signal, the clk_180 clock signal, and the clk_270 clock signal may enable further reduction in phase-to-phase mismatch and further reduction in phase-to-phase jitter relative to the use of a single ring oscillator circuit 406.

As shown in FIG. 14, each signal path for the clk_000 clock signal, the clk_090 clock signal, the clk_180 clock signal, and the clk_270 clock signal may include a plurality of inverter stages 1402a-1402c, which function as complementary metal oxide semiconductor (CMOS) fanout amplifier stages that increase in size. For example, the inverter stage 1402a may have an amplification strength of approximately 6×, the inverter stage 1402b may have an amplification strength of approximately 12×, the inverter stage 1402c may have an amplification strength of 24X and so on. The plurality of inverter stages 1402a-1402c may be preceded by a current mode logic (CML) to CMOS converter. Thus, the clk_000 clock signal, the clk_090 clock signal, the clk_180 clock signal, and the clk_270 clock signal may be referred to respectively as a clk_cml_000 clock signal, a clk_cml_090 clock signal, a clk_cml_180 clock signal, and a clk_cml_270 clock signal prior to CMOS conversion. The clk_000 clock signal, the clk_090 clock signal, the clk_180 clock signal, and the clk_270 clock signal may be referred to respectively as a clk_cmos_000 clock signal, a clk_cmos_090 clock signal, a clk_cmos_180 clock signal, and a clk_cmos_270 clock signal after CMOS conversion.

As further shown in FIG. 14, the ring oscillator circuit 406a and the ring oscillator circuit 406b may each be located between two inverter stages. For example, the ring oscillator circuit 406a may be located between the inverter stage 1402a and the inverter stage 1402b. As another example, the ring oscillator circuit 406b may be located between the inverter stage 1402b and the inverter stage 1402c.

Size or amplification strength of inverters 1404 in the ring oscillator circuit 406a, the size or amplification strength of inverters 1406 in the ring oscillator circuit 406b, the size or amplification strength of inverters 1408 in the ring oscillator circuit 406a, and/or the size or amplification strength of inverters 1410 in the ring oscillator circuit 406b may be selected to reduce the likelihood of self-oscillation in the data clock circuit 336. For example, the size or amplification strength of the inverters 1404 in the ring oscillator circuit 406a may be lesser relative to the size or amplification strength of the inverters in the inverter stage 1402a. In some implementations, the size or amplification strength of the inverters 1404 in the ring oscillator circuit 406a may be approximately half of the size or amplification strength of the inverters in the inverter stage 1402a.

As another example, the size or amplification strength of the inverters 1406 in the ring oscillator circuit 406b may be lesser relative to the size or amplification strength of the inverters in the inverter stage 1402b. In some implementations, the size or amplification strength of the inverters 1406 in the ring oscillator circuit 406a may be approximately half of the size or amplification strength of the inverters in the inverter stage 1402b.

In some implementations, the size or amplification strength of the inverters 1406 in the ring oscillator circuit 406b, and the size or amplification strength of the inverters 1404 in the ring oscillator circuit 406a, may be different sizes or different application strengths. In some implementations, the size or amplification strength of the inverters 1406 in the ring oscillator circuit 406b may be greater relative to the size or amplification strength of the inverters 1404 in the ring oscillator circuit 406a.

As indicated above, FIG. 14 is provided as an example. Other examples may differ from what is described with regard to FIG. 14.

Figure 15:
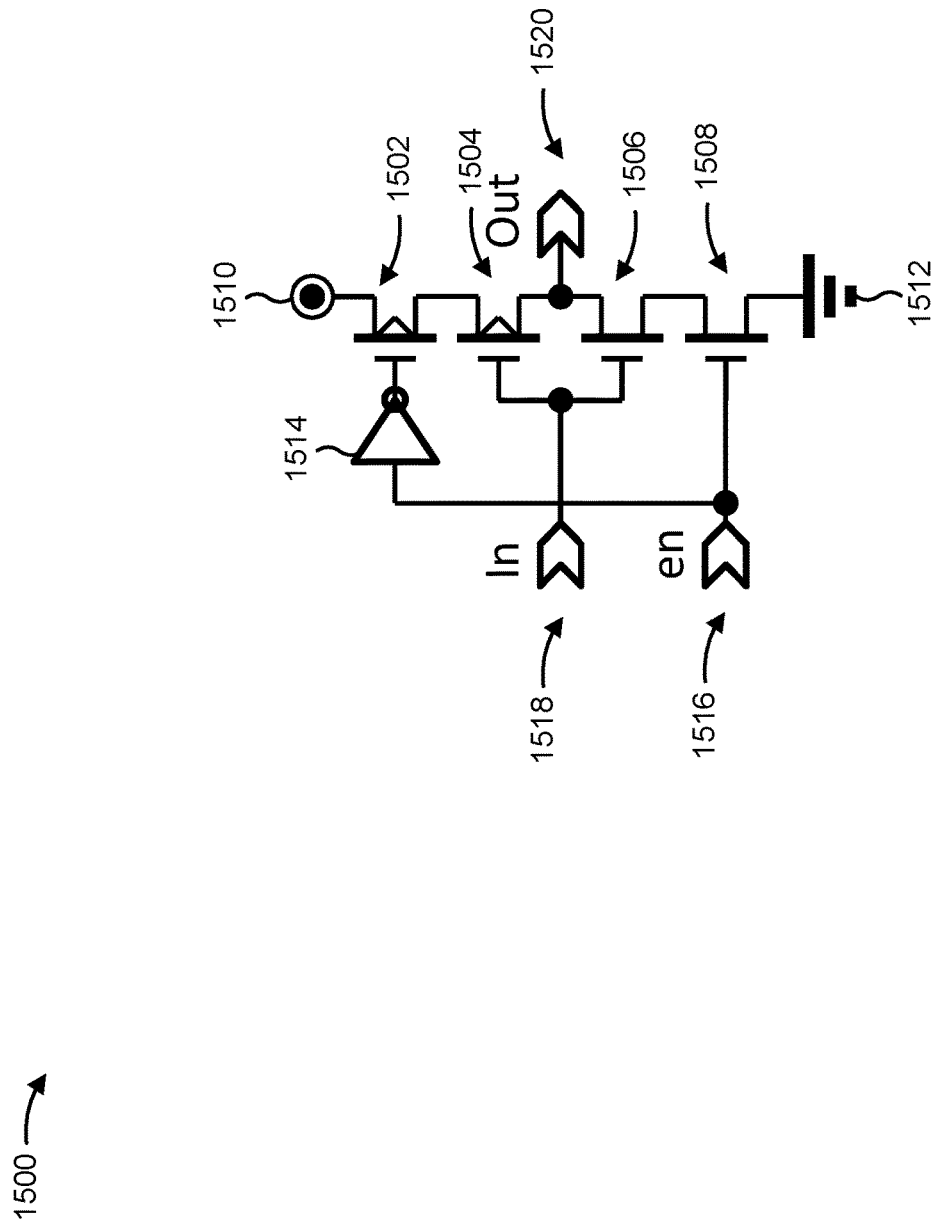
FIG. 15 is a diagram of an example tristate inverter described herein.

FIG. 15 is a diagram of an example tristate inverter 1500 described herein. In some implementations, the inverters 704b, 704d, 704f, 704h, 804a-804d, 904b, 904d, 904f, 904h, 1206, 1306, 1408, and 1406 may be converted to the tristate inverter 1500. This may enable one or more implementations of the ring oscillator circuit 406 described herein to be selectively disabled.

The tristate inverter 1500 may include a plurality of transistors 1502-1508 that are connected to VDD 1510 and ground 1512. An inverter 1514 is connected to the gate of the transistor 1502. A control signal (en) may be provided to the tristate inverter 1500 from a control signal input 1516. A high control signal (en-high) provided to the control signal input 1516 may cause the tristate inverter 1500 to operate as an inverter. Here the inverters 704b, 704d, 704f, 704h, 804a-804d, 904b, 904d, 904f, 904h, 1206, 1306, 1408, and 1406 that are implemented as the tristate inverter 1500 may be operating in an "on" mode and permitting clock signals to propagate from an input 1518 of the tristate inverter 1500 to an output 1520 of the tristate inverter. In this operating mode, the ring oscillator circuit 406 is active and is interpolating the clock signals propagating through the ring oscillator circuit 406.

A low control signal (en-low) provided to the control signal input 1516 may cause the tristate inverter 1500 to transition to a high impedance state, which results in the formation of an open circuit between the input 1518 and the output 1520. Here, the inverters 704b, 704d, 704f, 704h, 804a-804d, 904b, 904d, 904f, 904h, 1206, 1306, 1408, and 1406 that are implemented as the tristate inverter 1500 may be operating in an "off" mode and preventing clock signals from propagating from the input 1518 of the tristate inverter 1500 to the output 1520 of the tristate inverter. In this operating mode, the ring oscillator circuit 406 is deactivated.

In some cases, the example implementations of the ring oscillator circuit 406 described herein may consume additional power and may be less effective at low operating frequencies (e.g., below approximately 2.5 Ghz). Accordingly, the use of tristate inverters 1500 for one or more of the inverters 704b, 704d, 704f, 704h, 804a-804d, 904b, 904d, 904f, 904h, 1206, 1306, 1408, and 1406 enables the ring oscillator circuit 406 to be configured to be selectively disabled to reduce power consumption of the data clock circuit 316 (e.g., when an operating frequency of the data clock circuit 316 does not satisfy threshold frequency). Even though the ring oscillator circuit 406 is disabled, the ring oscillator circuit 406 may still provide coupling between complementary phases of the clk_000 clock signal, the clk_090 clock signal, the clk_180 clock signal, and the clk_270 clock signal (e.g., coupling between the clk_000 clock signal and the clk_180 clock signal, and between the clk_090 clock signal and the clk_270 clock signal). Which enables the ring oscillator circuit 406 to still provide alignment of opposing edges (e.g., rising edges 502 and falling edges 506) of the complementary phases of the clk_000 clock signal, the clk_090 clock signal, the clk_180 clock signal, and the clk_270 clock signal.

As indicated above, FIG. 15 is provided as an example. Other examples may differ from what is described with regard to FIG. 15.

Figure 16:
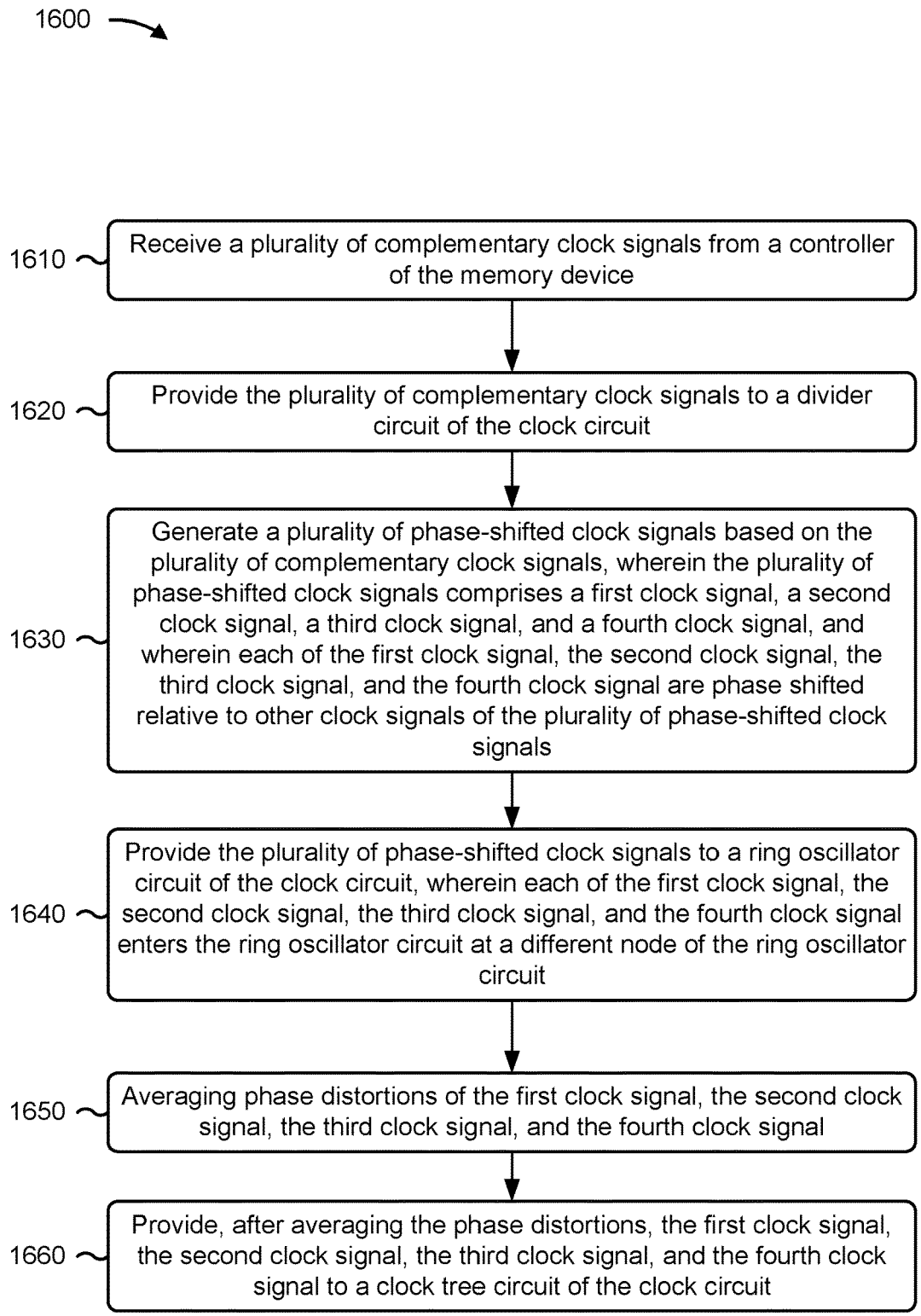
FIG. 16 is a flowchart of an example method associated with phase-to-phase mismatch reduction in a clock circuit of a memory device.

FIG. 16 is a flowchart of an example method 1600 associated with phase-to-phase mismatch reduction in a clock circuit of a memory device. In some implementations, a data clock circuit (e.g., data clock circuit 316) may perform or may be configured to perform one or more process blocks of FIG. 16. In some implementations, another device or a group of devices separate from or including the data clock circuit (e.g., a receiver circuit 402, a divider circuit 404, a ring oscillator circuit 406, a clock tree circuit 408) may perform or may be configured to perform one or more process blocks of FIG. 16.

As shown in FIG. 16, the method 1600 may include receiving a plurality of complementary clock signals from a controller of the memory device (block 1610). As further shown in FIG. 16, the method 1600 may include providing the plurality of complementary clock signals to a divider circuit of the clock circuit (block 1620). As further shown in FIG. 16, the method 1600 may include generating a plurality of phase-shifted clock signals based on the plurality of complementary clock signals, where the plurality of phase-shifted clock signals include a first clock signal, a second clock signal, a third clock signal, and a fourth clock signal, and where each of the first clock signal, the second clock signal, the third clock signal, and the fourth clock signal are phase shifted relative to other clock signals of the plurality of phase-shifted clock signals (block 1630). As further shown in FIG. 16, the method 1600 may include providing the plurality of phase-shifted clock signals to a ring oscillator circuit of the data clock circuit, where each of the first clock signal, the second clock signal, the third clock signal, and the fourth clock signal enters the ring oscillator circuit at a different node of the ring oscillator circuit (block 1640). As further shown in FIG. 16, the method 1600 may include averaging phase distortions of the first clock signal, the second clock signal, the third clock signal, and the fourth clock signal (block 1650). As further shown in FIG. 16, the method 1600 may include providing, after averaging the phase distortions, the first clock signal, the second clock signal, the third clock signal, and the fourth clock signal to a clock tree circuit of the data clock circuit (block 1660).

Although FIG. 16 shows example blocks of a method 1600, in some implementations, the method 1600 may include additional blocks, fewer blocks, different blocks, or differently arranged blocks than those depicted in FIG. 16. Additionally, or alternatively, two or more of the blocks of the method 1600 may be performed in parallel. The method 1600 is an example of one method that may be performed by one or more devices described herein. These one or more devices may perform or may be configured to perform one or more other methods based on operations described herein, such as the operations described in connection with FIGS. 1-15.

In some implementations, a device includes a memory cell array; and a clock circuit configured to generate a plurality of clock signals for access operations associated with the memory cell array, the clock circuit comprising: a ring oscillator circuit configured to equalize phase distortions of the plurality of clock signals.

In some implementations, a clock circuit of a memory device includes a receiver circuit configured to receive a plurality of complementary clock signals; and provide the plurality of complementary clock signals to a divider circuit of the clock circuit; the divider circuit configured to: generate a plurality of phase-shifted clock signals based on the plurality of complementary clock signals, wherein the plurality of phase-shifted clock signals comprises a first clock signal, a second clock signal, a third clock signal, and a fourth clock signal, and wherein each of the first clock signal, the second clock signal, the third clock signal, and the fourth clock signal are phase shifted relative to other clock signals of the plurality of phase-shifted clock signals; and provide the plurality of phase-shifted clock signals to a ring oscillator circuit of the clock circuit, and the ring oscillator circuit comprising a plurality of coupled ring oscillators that are configured to average phase distortions of the first clock signal, the second clock signal, the third clock signal, and the fourth clock signal.

In some implementations, a device includes a memory cell array; and a clock circuit configured to generate a plurality of clock signals for access operations associated with the memory cell array, the clock circuit comprising: a ring oscillator circuit, comprising: a plurality of sets of inverters that are arranged in respective ring oscillators, wherein each of the plurality of clock signals is directly coupled to two or more of the respective ring oscillators.

In some implementations, a device includes a memory cell array; and a clock circuit configured to generate a plurality of clock signals for access operations associated with the memory cell array, the clock circuit comprising: a first ring oscillator circuit and a second ring oscillator circuit that are configured to average phase distortions of the plurality of clock signals.

In some implementations, a method includes receiving, by a receiver circuit, of a clock circuit of a memory device, a plurality of complementary clock signals from a controller of the memory device; providing, by the receiver circuit, the plurality of complementary clock signals to a divider circuit of the clock circuit; generating, by the divider circuit, a plurality of phase-shifted clock signals based on the plurality of complementary clock signals, wherein the plurality of phase-shifted clock signals comprises a first clock signal, a second clock signal, a third clock signal, and a fourth clock signal, and wherein each of the first clock signal, the second clock signal, the third clock signal, and the fourth clock signal are phase shifted relative to other clock signals of the plurality of phase-shifted clock signals; providing, by the divider circuit, the plurality of phase-shifted clock signals to a ring oscillator circuit of the clock circuit, wherein each of the first clock signal, the second clock signal, the third clock signal, and the fourth clock signal enters the ring oscillator circuit at a different node of the ring oscillator circuit; averaging, by the ring oscillator circuit, phase distortions of the first clock signal, the second clock signal, the third clock signal, and the fourth clock signal; and providing, by the ring oscillator circuit and after averaging the phase distortions, the first clock signal, the second clock signal, the third clock signal, and the fourth clock signal to a clock tree circuit of the clock circuit.

The foregoing disclosure provides illustration and description but is not intended to be exhaustive or to limit the implementations to the precise forms disclosed. Modifications and variations may be made in light of the above disclosure or may be acquired from practice of the implementations described herein.

Even though particular combinations of features are recited in the claims and/or disclosed in the specification, these combinations are not intended to limit the disclosure of implementations described herein. Many of these features may be combined in ways not specifically recited in the claims and/or disclosed in the specification. For example, the disclosure includes each dependent claim in a claim set in combination with every other individual claim in that claim set and every combination of multiple claims in that claim set. As used herein, a phrase referring to "at least one of" a list of items refers to any combination of those items, including single members. As an example, "at least one of: a, b, or c" is intended to cover a, b, c, a+b, a+c, b+c, and a+b+c, as well as any combination with multiples of the same element (e.g., a+a, a+a+a, a+a+b, a+a+c, a+b+b, a+c+c, b+b, b+b+b, b+b+c, c+c, and c+c+c, or any other ordering of a, b, and c).

No element, act, or instruction used herein should be construed as critical or essential unless explicitly described as such. Also, as used herein, the articles "a" and "an" are intended to include one or more items and may be used interchangeably with "one or more." Further, as used herein, the article "the" is intended to include one or more items referenced in connection with the article "the" and may be used interchangeably with "the one or more." Where only one item is intended, the phrase "only one," "single," or similar language is used. Also, as used herein, the terms "has," "have," "having," or the like are intended to be open-ended terms that do not limit an element that they modify (e.g., an element "having" A may also have B). Further, the phrase "based on" is intended to mean "based, at least in part, on" unless explicitly stated otherwise. As used herein, the term "multiple" can be replaced with "a plurality of" and vice versa. Also, as used herein, the term "or" is intended to be inclusive when used in a series and may be used interchangeably with "and/or," unless explicitly stated otherwise (e.g., if used in combination with "either" or "only one of").

What is claimed is:

1. A device, comprising:
   a memory cell array; and
   a clock circuit configured to generate a plurality of clock signals for access operations associated with the memory cell array, the clock circuit comprising:
      a divider circuit configured to receive complementary output clock signals and generate the plurality of clock signals based on the complementary output clock signals; and
      a ring oscillator circuit configured to receive the plurality of clock signals from the divider circuit and equalize phase distortions of the plurality of clock signals,
      wherein each of the plurality of clock signals enters the ring oscillator circuit at a particular node and exits the ring oscillator circuit at the particular node.

2. The device of claim 1, wherein each clock signal of the plurality of clock signals is phase-shifted relative to other clock signals of the plurality of clock signals.

3. The device of claim 1, wherein a portion of the ring oscillator circuit, associated with a first clock signal of the plurality of clock signals, is coupled with a portion of the ring oscillator circuit that is associated with a second clock signal of the plurality of clock signals having a phase that is orthogonal to a phase of the first clock signal.

4. The device of claim 3, wherein the phase of the second clock signal is phase delayed relative to the phase of the first clock signal by two or more inverters in the ring oscillator circuit.

5. The device of claim 1, wherein the plurality of clock signals are coupled through a plurality of inverters in the ring oscillator circuit.

6. The device of claim 1, wherein the plurality of clock signals are coupled through a plurality of inverter loops in the ring oscillator circuit.

7. The device of claim 1, wherein the ring oscillator circuit comprises:
   a plurality of inverters connected in series; and
   a plurality of counter-connected inverter pairs connected with the plurality of inverters.

8. A device, comprising:
   a memory cell array; and
   a clock circuit configured to generate a plurality of clock signals for access operations associated with the memory cell array, the clock circuit comprising:
      a divider circuit configured to receive complementary output clock signals and generate the plurality of clock signals based on the complementary output clock signals; and
      a ring oscillator circuit configured to receive the plurality of clock signals from the divider circuit, the ring oscillator circuit comprising a plurality of sets of inverters that are arranged in respective ring oscillators,
      wherein each of the plurality of clock signals is directly coupled to two or more of the respective ring oscillators, and
      wherein each of the plurality of clock signals enters the ring oscillator circuit at a particular node and exits the ring oscillator circuit at the particular node.

9. The device of claim 8, wherein the ring oscillator circuit is configured to be deactivated when an operating frequency of the clock circuit does not satisfy a threshold frequency.

10. The device of claim 9, wherein an inverter, included in a set of inverters of the plurality of sets of inverters, is configured to be operated as a tristate inverter to deactivate the ring oscillator circuit when the operating frequency of the clock circuit does not satisfy the threshold frequency.

11. The device of claim 9, wherein the ring oscillator circuit is configured to align opposing edges of complementary pairs of the plurality of clock signals when the ring oscillator circuit is deactivated.

12. The device of claim 8, wherein the respective ring oscillators are configured to self-interpolate at least one of the plurality of clock signals with multiple phase-delayed versions of the at least one of the plurality of clock signals.

13. The device of claim 8, wherein a quantity of the respective ring oscillators included in the ring oscillator circuit is based on an operating frequency range of the clock circuit.

14. A method, comprising:
   receiving, at a divider circuit of a clock circuit of a memory device, complementary output clock signals;
   generating, at the divider circuit, a plurality of clock signals, for access operations associated with the memory device, based on the complementary output clock signals;
   receiving, at a ring oscillator circuit of the clock circuit, the plurality of clock signals from the divider circuit, wherein each of the plurality of clock signals enters the ring oscillator circuit at a particular node and exits the ring oscillator circuit at the particular node;
   equalizing phase distortions of the plurality of clock signals using the ring oscillator circuit; and
   outputting the plurality of clock signals, having equalized phase distortions, from the ring oscillator circuit via the particular nodes.

15. The method of claim 14, wherein each clock signal of the plurality of clock signals is phase-shifted relative to other clock signals of the plurality of clock signals.

16. The method of claim 14, wherein the plurality of clock signals comprises a first clock signal, a second clock signal, a third clock signal, and a fourth clock signal.

17. The method of claim 16, further comprising:
   averaging, by the ring oscillator circuit, phase distortions of the plurality of clock signals.

18. The method of claim 14, wherein a phase of a first clock signal, that is orthogonal to a phase of a second clock signal, is phase delayed relative to the phase of the second clock signal by two or more inverters in the ring oscillator circuit.

19. The method of claim 14, wherein the plurality of clock signals are coupled through a plurality of inverters in the ring oscillator circuit.

20. The method of claim 14, wherein the plurality of clock signals are coupled through a plurality of inverter loops in the ring oscillator circuit.

* * * * *